US008085098B2

(12) United States Patent  
Yamazaki

(10) Patent No.: US 8,085,098 B2
(45) Date of Patent: Dec. 27, 2011

(54) PLL CIRCUIT

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 162 days.

(21) Appl. No.: 12/560,395

(22) Filed: Sep. 15, 2009

(65) Prior Publication Data

US 2010/0090768 A1    Apr. 15, 2010

(30) Foreign Application Priority Data

Oct. 10, 2008 (JP) ................................ 2008-264634
Oct. 10, 2008 (JP) ................................ 2008-264635

(51) Int. Cl.
*H03L 7/00* (2006.01)

(52) U.S. Cl. ............ 331/10; 331/17; 331/57; 331/182; 331/185; 331/186

(58) Field of Classification Search .................... 331/10, 331/11, 15, 16, 57, 182, 183, 185, 186
See application file for complete search history.

(56) References Cited

U.S. PATENT DOCUMENTS

| 5,382,922 | A  | * | 1/1995  | Gersbach et al. ............. 331/1 A |
| 5,942,949 | A  | * | 8/1999  | Wilson et al. ................... 331/17 |
| 7,049,866 | B2 | * | 5/2006  | Wilson .......................... 327/157 |
| 7,521,971 | B2 |   | 4/2009  | Yamazaki |
| 2002/0075080 | A1 | * | 6/2002 | Nelson et al. .................... 331/11 |
| 2002/0079973 | A1 | * | 6/2002 | Higashi et al. ................... 331/16 |
| 2003/0038661 | A1 | * | 2/2003 | Chokkalingam et al. ..... 327/157 |
| 2007/0030079 | A1 | * | 2/2007 | Kawamoto et al. ............. 331/16 |
| 2007/0247235 | A1 | * | 10/2007 | Gatta .............................. 331/16 |
| 2008/0106345 | A1 | * | 5/2008 | Huang ............................ 331/57 |
| 2008/0129402 | A1 | * | 6/2008 | Han et al. ....................... 331/179 |

FOREIGN PATENT DOCUMENTS

JP    11-195983 A    7/1999
JP    2000-4156 A    1/2000

OTHER PUBLICATIONS

Yoshikazu Yamazaki, U.S. Appl. No. 12/561,239, filed Sep. 16, 2009.

* cited by examiner

*Primary Examiner* — Joseph Chang
*Assistant Examiner* — Jeffrey Shin
(74) *Attorney, Agent, or Firm* — Fitzpatrick, Cella, Harper & Scinto

(57) ABSTRACT

A PLL circuit comprising an oscillation unit, a frequency division unit, a phase comparison unit, and a generation unit comprises a switching unit that switches between a first state in which a control voltage output from the generation unit is input into the oscillation unit and a second state in which a reference voltage is input into the oscillation unit; and a correction unit that, in the second state, compares the control voltage output from the generation unit with the reference voltage, and corrects a frequency at which the oscillation unit oscillates with respect to a voltage input into the oscillation unit, such that the control voltage output from the generation unit is equivalent to the reference voltage.

15 Claims, 7 Drawing Sheets

PLL CIRCUIT

BACKGROUND OF THE INVENTION

1. Field of the Invention

The present invention relates to a PLL circuit.

2. Description of the Related Art

In recent years, an information recording device that writes and reads out data to and from a recording medium such as an optical disc (for example, a CD-R, a DVD-R/RW) obtains a rotation synchronizing signal of the recording medium, extracts a synchronous clock based on the signal, and uses this clock as a recording clock when performing data recording processing. Generally, a PLL (Phase Locked Loop) circuit is used for extracting such a periodic clock.

In Japanese Patent Laid-Open No. 2000-4156, a PLL circuit having automatically selectable VCO properties is described as shown in FIG. 1 of Japanese Patent Laid-Open No. 2000-4156. In the PLL circuit, a phase comparator 2 compares the phase of a reference input from an input terminal 1 and that of an output clock fed from a frequency divider 6, and supplies the error signal to a direct current amplifier 3. The direct current amplifier 3 amplifies the supplied error signal, and supplies the amplified signal to a low-pass filter 4. The low-pass filter 4 filters an unnecessary-frequency component from the supplied error signal, and supplies the resulting signal to a voltage-controlled oscillator 11. The voltage-controlled oscillator 11 oscillates the output clock having a frequency based on a selected VCO property according to the supplied error signal, and supplies the clock to the frequency divider 6. The frequency divider 6 divides a frequency of the supplied output clock, outputs the clock from an output terminal 7, and also feeds back the clock to the phase comparator 2.

Here, as shown in FIG. 2 of Japanese Patent Laid-Open No. 2000-4156, the voltage-controlled oscillator 11 in Japanese Patent Laid-Open No. 2000-4156 has a plurality of different VCO properties so as to satisfy a desired frequency range. In Japanese Patent Laid-Open No. 2000-4156, it is described that one of these VCO properties is, selected.

Specifically, in the PLL circuit shown in FIG. 1 of Japanese Patent Laid-Open No. 2000-4156, an upper-limit-voltage comparator 15 and a lower-limit-voltage comparator 16 compare and determine whether the error signal filtered by the low-pass filter 4 is in the range from the upper limit voltage to the lower limit voltage shown in FIG. 2 of Japanese Patent Laid-Open No. 2000-4156. The upper-limit-voltage comparator 15 and the lower-limit-voltage comparator 16 supply the determination signal to a VCO property switcher 17. The VCO property switcher 17 does not switch a VCO property when an error signal is at a point A within the range from the upper limit voltage to lower limit voltage shown in FIG. 2 of Japanese Patent Laid-Open No. 2000-4156. The VCO property switcher 17 switches to a VCO property having a higher oscillation frequency according to a control voltage than that of the selected VCO property, when an error signal is at a point B that is the upper limit voltage or greater shown in FIG. 2 of Japanese Patent Laid-Open No. 2000-4156. The VCO property switcher 17 switches to a VCO property having a lower oscillation frequency according to a control voltage than that of the selected VCO property, when an error signal is at a point D that is the lower limit voltage or less shown in FIG. 2 of Japanese Patent Laid-Open No. 2000-4156.

Thus, according to Japanese Patent Laid-Open No. 2000-4156, it is possible to automatically switch to the optimal VCO property according to an error signal, and control it.

In Japanese Patent Laid-Open No. 11-195983, a charge pump phase locked loop 300 is described as shown in FIG. 3 of Japanese Patent Laid-Open No. 11-195983. In this charge pump phase locked loop 300, a phase/frequency detector (PFD) 302 compares the phase of an input signal $F_{IN}$ with the phase of a feedback signal $F_{FB}$ when performing a usual PLL operation. According to a result of the comparison, the PFD 302 generates an error signal, which is either an up signal U or a down signal D, and supplies the signal to a charge pump 304. Depending on whether the error signal is the up signal or the down signal, the charge pump 304 applies charge to a capacitance of a loop filter 306, or removes charge from the capacitance, and generates a loop filter voltage $V_{LF}$. The loop filter 306 supplies the loop filter voltage $V_{LF}$ to a voltage-controlled oscillator 308 via a switch SW1 that has been turned on. The voltage-controlled oscillator 308 generates and outputs an internal signal $F_{OSC}$ determined based on a selected VCO operating curve, according to the supplied loop filter voltage $V_{LF}$.

Here, the voltage-controlled oscillator 308 shown in FIG. 3 of Japanese Patent Laid-Open No. 11-195983 has many VCO operating curves as shown in FIG. 2 of Japanese Patent Laid-Open No. 11-195983 similar to the voltage-controlled oscillator 108 shown in FIG. 1 of Japanese Patent Laid-Open No. 11-195983. In Japanese Patent Laid-Open No. 11-195983, it is described that one VCO operating curve is selected (trimmed) among many VCO operating curves using a special digital control input value N.

Specifically, in the charge pump phase locked loop 300 shown in FIG. 3 of Japanese Patent Laid-Open No. 11-195983, when automatically trimming, the switch SW1 is opened, and a switch SW2 is closed. A reference voltage $V_{REF}$ is supplied to the voltage-controlled oscillator 308, instead of a loop filter voltage $V_{LF}$. The charge pump 304 supplies a loop filter voltage $V_{LF}$ to a state machine 316. The state machine 316 sequentially selects a digital control input value N and supplies the value to the voltage-controlled oscillator 308, so as to sequentially select a different VCO operating curve. The state machine 316 detects that a loop filter voltage $V_{LF}$ has converged on a suitable quiescent potential (either grounding or $V_{DD}$). According to this detection, the state machine 316 specifies two VCO operating curves that have center frequencies just above and just below the frequency of an input signal $F_{IN}$, and selects one of the two specified VCO operating curves for use when performing an usual PLL operation.

Thus, according to Japanese Patent Laid-Open No. 11-195983, a suitable VCO operating curve can be automatically selected.

Now, consider a PLL circuit comprising a phase comparator, a charge pump circuit, a low pass filter, a voltage-controlled oscillator (VCO circuit), and a frequency dividing circuit. The loop properties of this PLL circuit are determined based on the gain property and frequency property of a circuit to be configured, and by appropriately designing these Properties, a property such as the lock-in time necessary for a phase to be locked or the jitter can be as desired. Particularly, regarding the gain property of these PLL properties, the gain property of the VCO circuit becomes dominant.

The gain property of a VCO circuit (control voltage-oscillation frequency property) changes due to variations in power supply voltages and manufacturing processes. When the VCO circuit has a high gain, the change in the oscillation frequency due to extraneous noise being superposed on a control voltage input into the VCO circuit becomes large, so as to increase jitter. On the other hand, when the VCO circuit has a low gain, even with the upper limit within the settable range of the control voltage determined based on the power supply voltage or a circuit configuration, the oscillation frequency of a signal output from the VCO circuit may not reach a desired frequency. Consequently, when the gain of a VCO circuit varies with respect to a designed value, due to the increase in jitter or lock-in time, the PLL properties may not be as desired.

In Japanese Patent. Laid-Open No. 2000-4156, as shown in FIGS. 8 and 9 of Japanese Patent Laid-Open No. 2000-4156, it is described that variations in gains within the range between the upper limit voltage and the lower limit voltage of a desired frequency range are allowed with respect to the control voltage to the VCO circuit when the circuit is locked. Accordingly, the gain of the corrected VCO circuit is allowed to have a certain amount of variation; thus, the PLL properties may not be desired properties.

In Japanese Patent Laid-Open No. 11-195983, as described above, it is described that one VCO operating curve is selected from among many VCO operating curves. Due to variations in the gain properties, or the like, a VCO operating curve corresponding to desired PLL properties may not exist among these many preset VCO operating curves. In this case, even when one VCO operating curve is selected from among many VCO operating curves, the PLL properties may not be desired properties.

Further, in Japanese Patent Laid-Open No. 11-195983, it is described that one operating curve with which a loop filter voltage $V_{LF}$ converges on a quiescent potential (either grounding or $V_{DD}$) is selected from among many operating curves. In this case, since a voltage that is different from that at the time of automatic trimming is input into the voltage-controlled oscillator 308 of Japanese Patent Laid-Open No. 11-195983 at the time of a usual PLL operation after the automatic trimming has been performed; thus, the PLL circuit may not operate based on the desired properties.

SUMMARY OF THE INVENTION

The present invention provides for making a PLL response property of a PLL circuit a desired property according to a reference voltage.

According to a first aspect of the present invention, there is provided a PLL circuit comprising an oscillation unit that generates an internal signal by oscillating at a frequency according to an input voltage, a frequency division unit that divides a frequency of the internal signal so as to generate a frequency-divided signal, a phase comparison unit that compares a phase of a reference signal input from outside with a phase of the frequency-divided signal received from the frequency division unit, and outputs a phase error signal according to a result of the comparison, and a generation unit that generates a control voltage based on the phase error signal, the PLL circuit comprising: a switching unit that switches between a first state in which the control voltage output from the generation unit is input into the oscillation unit and a second state in which a reference voltage is input into the oscillation unit; and a correction unit that, in the second state, compares the control voltage output from the generation unit with the reference voltage, and corrects a frequency at which the oscillation unit oscillates with respect to a voltage input into the oscillation unit, such that the control voltage output from the generation unit is equivalent to the reference voltage.

According to a second aspect of the present invention, there is provided a PLL circuit comprising an oscillation unit that generates an internal signal by oscillating at a frequency according to an input voltage, a frequency division unit that divides a frequency of the internal signal so as to generate a frequency-divided signal, a phase comparison unit that compares a phase of a reference signal input from outside with a phase of the frequency-divided signal received from the frequency division unit, and outputs a phase error signal according to a result of the comparison, and a generation unit that generates a control voltage based on the phase error signal, the PLL circuit comprising: a switching unit that switches between a first state in which the control voltage output from the generation unit is input into the oscillation unit and a second state in which a reference voltage is input into the oscillation unit; and a correction unit that, in the second state, compares a frequency of the frequency-divided signal with a frequency of the reference signal, and corrects a frequency at which the oscillation unit oscillates with respect to a voltage input into the oscillation unit, such that the frequency of the frequency-divided signal is equivalent to the frequency of the reference signal.

According to a third aspect of the present invention, there is provided a PLL circuit comprising an oscillation unit that generates an internal signal by oscillating at a frequency according to an input voltage, a frequency division unit that divides a frequency of the internal signal so as to generate a frequency-divided signal, a phase comparison unit that compares a phase of a reference signal input from outside with a phase of the frequency-divided signal received from the frequency division unit, and outputs a phase error signal according to a result of the comparison, and a generation unit that generates a control voltage based on the phase error signal, the PLL circuit comprising: a switching unit that switches between a first state in which the control voltage output from the generation unit is input into the oscillation unit, a third state in which a first reference voltage is input into the oscillation unit, and a fourth state in which a second reference voltage higher than the first reference voltage is input into the oscillation unit; and a correction unit that compares an absolute value of frequency difference between a frequency of the frequency-divided signal in the third state and a frequency of the frequency-divided signal in the fourth state with a desired value, and that corrects a frequency at which the oscillation unit oscillates with respect to a voltage input into the oscillation unit, such that the absolute value of the frequency difference between the frequency of the frequency-divided signal in the third state and the frequency of the frequency-divided signal in the fourth state is equivalent to the desired value.

According to the present invention, a PLL response property of a PLL circuit can be a desired property according to a reference voltage.

Further features of the present invention will become apparent from the following description of exemplary embodiments with reference to the attached drawings.

DESCRIPTION OF THE EMBODIMENTS

Figure 1:
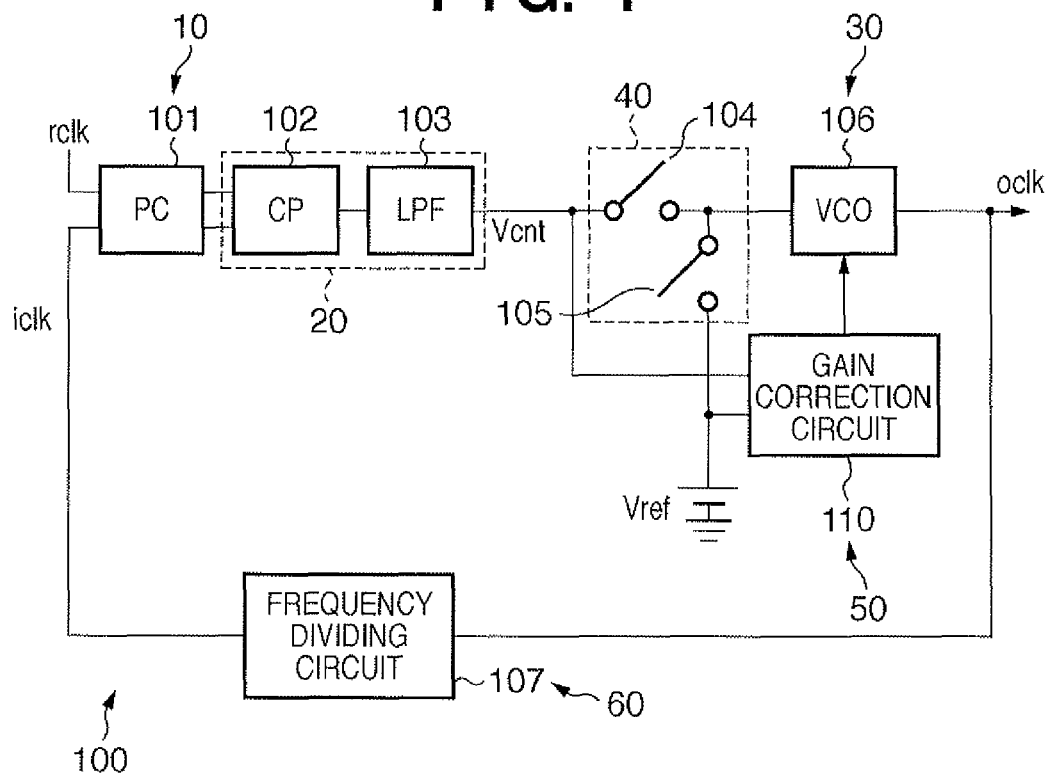
FIG. 1 is a diagram showing the configuration of a PLL circuit 100 according to a first embodiment of the present invention.

A PLL (Phase Locked Loop) circuit 100 according to a first embodiment of the present invention is described with reference to FIG. 1. FIG. 1 is a diagram showing the configuration of the PLL circuit 100 according to the first embodiment of the present invention.

The PLL circuit 100 generates an internal signal oclk that has a specific phase relation with respect to a reference signal rclk input from the outside. The PLL circuit 100 comprises a frequency division unit 60, a phase comparison unit 10, a generation unit 20, a switching unit 40, an oscillation unit 30, and a correction unit 50.

The frequency division unit 60 divides a frequency of an internal signal oclk, and generates a frequency-divided signal iclk. The frequency division unit 60 includes a frequency dividing circuit 107. The frequency dividing circuit 107 divides a frequency of the internal signal oclk based on the number of frequency divisions previously designated, generates the frequency-divided signal iclk, and feeds back the signal to the phase comparison unit 10.

The phase comparison unit 10 compares the phase of the reference signal rclk received from the outside with the phase of the frequency-divided signal iclk received from the frequency division unit 60, and outputs a phase error signal according to a result of the comparison. The phase comparison unit 10 includes a phase comparator (PC) 101. The phase comparator 101 outputs a phase error signal to the generation unit 20 according to the phase difference between the reference signal rclk and the frequency-divided signal iclk.

The generation unit 20 generates a control voltage based on the phase error signal. The generation unit 20 includes a charge pump circuit (CP) 102 and a low pass filter (LPF) 103.

The charge pump circuit 102 receives a phase error signal output from the phase comparator 101. The charge pump circuit 102 includes a capacitance, and generates a charge pump current by charging or discharging the capacitance based on the phase error signal. The charge pump circuit 102 outputs the generated charge pump current to the low pass filter 103.

The low pass filter 103 receives the charge pump current output from the charge pump circuit 102. The low pass filter 103 generates a control voltage Vcnt by smoothing the received charge pump current. The low pass filter 103 outputs the generated control voltage Vcnt to the switching unit 40 and the correction unit 50.

The switching unit 40 switches a first state where the control voltage Vcnt output from the generation unit 20 is input into the oscillation unit 30, and a second state where a reference voltage Vref is input into the oscillation unit 30. The switching unit 40 includes a first control switch 104 and a second control switch 105.

The first control switch 104 turns on/off to establish/disestablish the conduction between the generation unit 20 and the oscillation unit 30. The second control switch 105 turns on/off to establish/disestablish the conduction of the reference voltage Vref to the oscillation unit 30. Consequently, the switching unit 40 switches to the first state by turning on the first control switch 104 (to the conductive state), and turning off the second control switch 105 (to the non-conductive state). The switching unit 40 switches to the second state by turning off the first control switch 104 (to the non-conductive state), and turning on the second control switch 105 (to the conductive state).

The oscillation unit 30 generates an internal signal oclk by oscillating at a frequency fo according to the input voltage. The oscillation unit 30 includes a voltage-controlled oscillator 106.

The voltage-controlled oscillator 106 receives the reference voltage Vref when the switching unit 40 switches to the second state. The voltage-controlled oscillator 106 generates an internal signal oclk by oscillating at a frequency fo (see FIG. 2) according to the received reference voltage Vref. The voltage-controlled oscillator 106 outputs an internal signal oclk to the frequency division unit 60.

When the switching unit 40 switches to the second state, the correction unit 50 corrects the gain of the oscillation unit 30 such that the control voltage Vcnt output from the generation unit 20 is equivalent to the reference voltage Vref. Here, the gain is a property of the frequency at which the oscillation unit 30 oscillates with respect to a voltage input into the oscillation unit 30. The correction unit 50 includes a gain correction circuit 110.

The gain correction circuit 110 continuously corrects the gain of the oscillation unit 30 by comparing the control voltage Vcnt output from the generation unit 20 with the reference voltage Vref.

Specifically, when the control voltage Vcnt is lower than the reference voltage Vref, the gain correction circuit 110 corrects the gain of the oscillation unit 30 such that the gain of the oscillation unit 30 falls. That is, the gain correction circuit 110 corrects the gain of the oscillation unit 30 such that the gain of the oscillation unit 30 falls when an oscillation frequency fo of the oscillation unit 30 is higher than a reference value (for example, fh>ft shown in FIG. 2).

When the control voltage Vcnt is higher than the reference voltage Vref, the gain correction circuit 110 corrects the gain of the oscillation unit 30 such that the gain of the oscillation unit 30 rises. That is, when an oscillation frequency fo of the oscillation unit 30 is lower than the reference value (for example, fl<ft shown in FIG. 2), the gain correction circuit 110 corrects the gain of the oscillation unit 30 such that the gain of the oscillation unit 30 rises.

When the switching unit 40 switches to the first state, the voltage-controlled oscillator 106 receives the control voltage Vcnt output from the generation unit 20. The voltage-controlled oscillator 106 oscillates at a frequency fo according to the received control voltage Vcnt in a state where the gain thereof has been corrected, so as to generate an internal signal oclk. The voltage-controlled oscillator 106 outputs the internal signal oclk to the outside and to the frequency division unit 60.

Thus, the gain of the voltage-controlled oscillator 106 is continuously corrected such that the control voltage Vcnt output from the generation unit 20 is equivalent to the reference voltage Vref. Accordingly, in the second state, the gain property of the voltage-controlled oscillator 106 can be a desired property according to the reference voltage Vref.

The gain of the voltage-controlled oscillator 106 is, in the second state, corrected such that the voltage-controlled oscillator 106 generates an internal signal oclk for the control voltage Vcnt having a value equivalent to that of the reference voltage Vref to be output from the generation unit 20 in a state where the reference voltage Vref is input into the voltage-controlled oscillator 106. Consequently, in the first state after the gain of the voltage-controlled oscillator 106 in the second state has been corrected, the same voltage as that in the second state can be input into the voltage-controlled oscillator 106. Thus, in the state after correction has been performed, the PLL circuit operates based on a desired property according to the reference voltage Vref.

That is, the PLL property of the PLL circuit can be a desired property according to the reference voltage. Note that an operation according to the PLL property, that is, a PLL operation indicates that feedback control is performed so that the frequency and phase of a frequency-divided signal iclk generated by the frequency division unit 60 correspond to the frequency and phase of the reference signal rclk.

Figure 2:
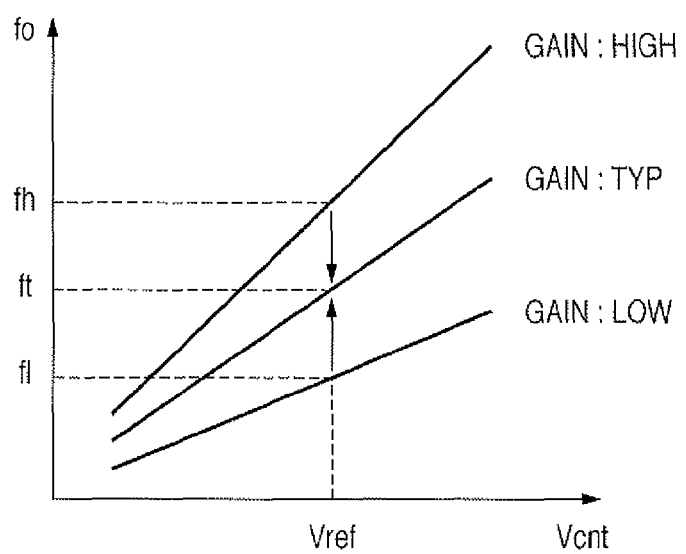
FIG. 2 is a diagram showing the gain properties of a voltage-controlled oscillator in the first embodiment of the present invention.

A gain-correcting operation by the gain correction circuit 110 is described with reference to FIG. 2. FIG. 2 is a diagram showing illustrative gain properties of a frequency fo of an internal signal oclk with respect to the control voltage Vcnt of the voltage-controlled oscillator 106. Here, for example, the slopes of lines that indicate the frequency properties in FIG. 2 represent gains.

FIG. 2 shows that an oscillation frequency is a reference value ft when the control voltage Vcnt is equivalent to the reference voltage Vref in the case where the gain of the voltage-controlled oscillator 106 matches that under TYP (typical) conditions. Here, the TYP conditions refer to a case where a power supply voltage has a typical value, and the properties of constituent elements of the voltage-controlled oscillator 106 that change due to variations in manufacturing processes are typical. This reference value ft is a frequency obtained by multiplying the frequency of an ideal reference signal rclk by the number of frequency divisions performed by the frequency dividing circuit 107. Here, in the case where the gain of the voltage-controlled oscillator 106 is high due to variations in power supply voltages or manufacturing processes, when the reference voltage Vref is input into the voltage-controlled oscillator 106, an oscillation frequency becomes fh higher than the reference value ft. Similarly, in the case of the gain being low, when the reference voltage Vref is input into the voltage-controlled oscillator 106, an oscillation frequency becomes fl lower than the reference value ft.

The PLL circuit in this embodiment corrects the difference from the gain property under TYP conditions with respect to the variations in gains of the voltage-controlled oscillator 106, using a gain-correcting signal from the gain correction circuit 110, such that the gain matches the gain property under TYP conditions.

When performing this gain-correcting operation, the first control switch 104 is put into an OFF state, and the second control switch 105 is put into an ON state. Therefore, the reference voltage Vref is input into the voltage-controlled oscillator 106, and the internal signal oclk with an oscillation frequency determined based on the gain property that the voltage-controlled oscillator 106 has is output.

Here, when the gain property is higher than that under TYP conditions, an oscillation frequency becomes fh higher than the reference value ft. Consequently, the control voltage Vcnt of the low pass filter 103 is raised so as to be closer to the reference voltage Vref from a value lower than the reference voltage Vref by an operation of the gain correction circuit 110 for lowering an oscillation frequency.

On the other hand, when the gain property is lower than that under TYP conditions, an oscillation frequency becomes fl lower than the reference value ft. Consequently, the control voltage Vcnt of the low pass filter 103 is lowered so as to be closer to the reference voltage Vref from a value higher than the reference voltage Vref by an operation of the gain correction circuit 110 for raising an oscillation frequency.

In this way, the gain correction circuit 110 compares the control voltage Vcnt output from the low pass filter 103 with the reference voltage Vref, and corrects the gain of the voltage-controlled oscillator 106 according to the difference between the voltages. The gain correction circuit 110 performs this gain-correcting operation until the difference between the control voltage Vcnt and the reference voltage Vref is eliminated, thereby enabling the gain of the voltage-controlled oscillator 106 to match the gain at the time of TYP conditions.

After performing this gain-correcting operation, it is possible to perform a usual PLL circuit operation using the voltage-controlled oscillator 106 that has a gain at the time of TYP conditions, with the first control switch 104 in the ON state and the second control switch 105 in the OFF state.

With the PLL circuit in this embodiment, even when a period for gain correction is provided, a lock-in time can be shortened. Here, before activating the circuit and starting a gain-correcting operation, the first control switch 104 and the second control switch 105 are put into the ON state. Consequently, before starting the gain-correcting operation, the reference voltage Vref can be applied to the control voltage Vcnt of the low pass filter 103 as an initial voltage.

If this initial voltage is not applied, the control voltage Vcnt slowly rises, for example, from a GND potential with the time constant set by the low pass filter 103; accordingly, it takes a long time for this voltage to be close to the Vref voltage.

On the other hand, in this embodiment, the time for the voltage to rise from a GND potential to the Vref voltage can be shortened by applying the Vref voltage as an initial voltage.

Therefore, in this embodiment, even when the gain of the voltage-controlled oscillator changes due to variations in power supply voltages and manufacturing processes, it is possible to obtain a desired PLL response property and also a stable PLL loop property by performing gain correction. Also, even when a period for gain correction is provided, a lock-in time can be shortened.

Figure 3:
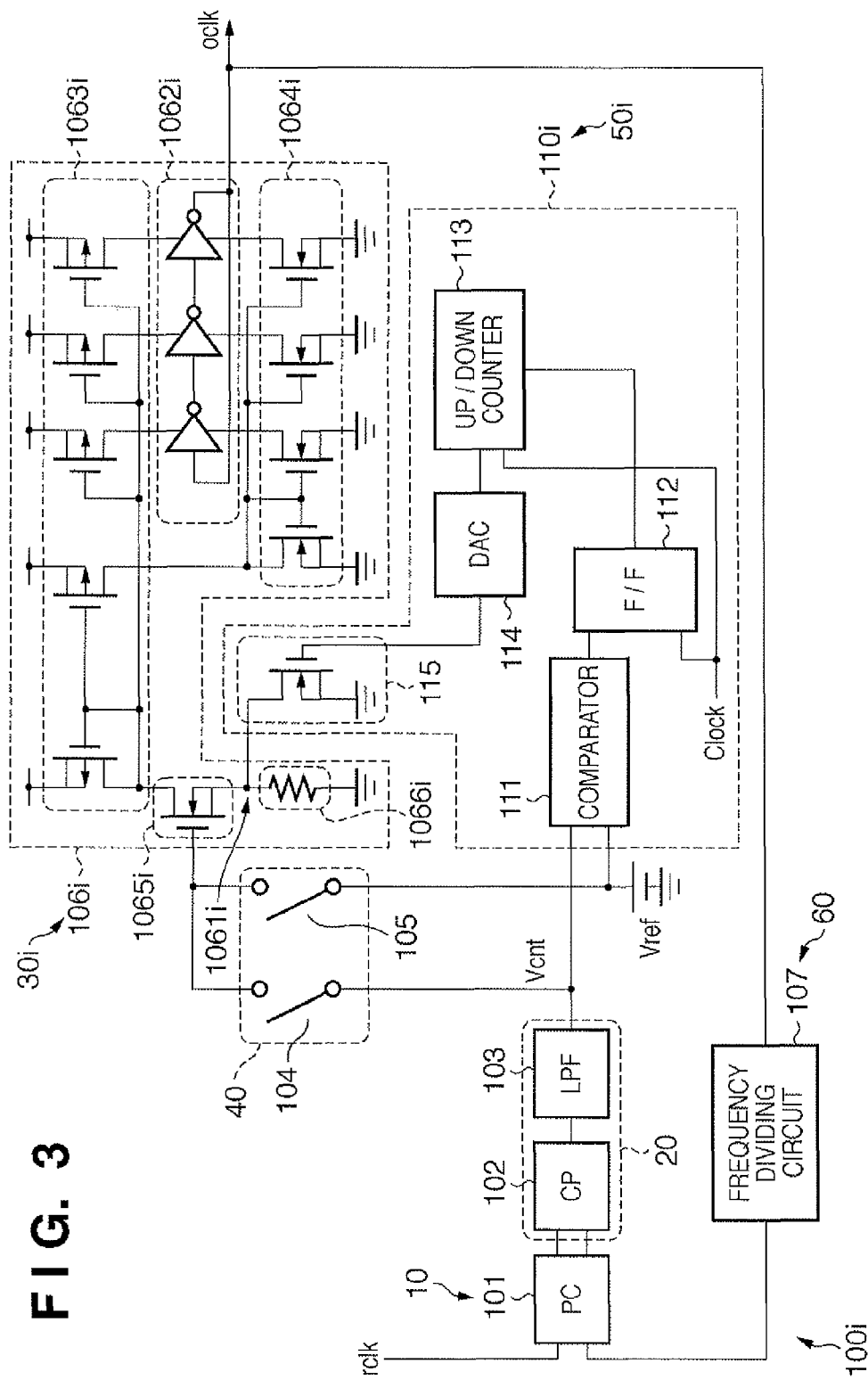
FIG. 3 is a diagram showing the configuration of a PLL circuit 100i according to a second embodiment of the present invention.

A PLL circuit 100*i* according to a second embodiment of the present invention is described with reference to FIG. 3. FIG. 3 is a diagram showing the configuration of the PLL circuit 100*i* according to the second embodiment of the present invention. Below, a description is given with emphasis on the aspects that differ from those in the first embodiment.

The PLL circuit 100*i* comprises an oscillation unit 30*i* and a correction unit 50*i*.

The oscillation unit 30*i* includes a voltage-controlled oscillator 106*i*. The voltage-controlled oscillator 106*i* includes an NMOS transistor 1065*i*, a load element 1066*i*, a ring oscillator 1062*i*, a current mirror circuit 1063*i*, and a current mirror circuit 1064*i*.

The control voltage Vcnt output from the generation unit 20 is input into the gate of the NMOS transistor 1065*i* (input transistor) in the first state, and the reference voltage Vref is input into the gate thereof in the second state. The NMOS transistor 1065*i* supplies a drain current for determining a prescribed gain with respect to a voltage input into the gate between its source and its drain by performing a source follower operation with the load element 1066*i* and a MOS transistor 115 (described later).

This drain current is copied (forwarded) by the current mirror circuit 1063*i* configured of a PMOS transistor, and the current mirror circuit 1064*i* configured of an NMOS transistor, and is supplied to the ring oscillator 1062*i*. That is, the current mirror circuit 1063*i* and the current mirror circuit 1064*i* supply currents according to the current that flows through the drain of the NMOS transistor 1065*i*, respectively.

The ring oscillator 1062*i* includes cascaded inverters in an odd number of stages (FIG. 3 shows this in the case of three steps). The ring oscillator 1062*i* receives currents supplied by the current mirror circuit 1063*i* and the current mirror circuit 1064*i*, and oscillates at the frequency according to the magnitude of the received currents. The oscillation frequency of the ring oscillator 1062*i* is controlled based on the magnitude of the driving current (the received current) supplied to the inverters thereof.

That is, a source 1061*i* of the NMOS transistor 1065*i* determines a property of the oscillation frequency of the ring oscillator 1062*i* with respect to the control voltage Vcnt input into the gate of the NMOS transistor 1065*i* based on the magnitude of the supplied drain current. That is, the source 1061*i* of the NMOS transistor 1065*i* determines the gain of the oscillation unit 30*i* based on the magnitude of the drain current supplied thereto. Specifically, the source 1061*i* of, the NMOS transistor 1065*i* is connected to the load element 1066*i*. The gain of the oscillation unit 30*i* lowers when the magnitude of the current supplied to the source 1061*i* of the NMOS transistor 1065*i* decreases, and rises when the magnitude of the current supplied to the source 1061*i* of the NMOS transistor 1065*i* increases.

The correction unit 50*i* includes a gain correction circuit 110*i*. The gain correction circuit 110*i* includes a comparator (voltage comparison unit) 111, a flip-flop (holding unit) 112, an up/down counter (control value holding unit) 113, a D/A converter (DAC, D/A conversion unit) 114, and the MOS transistor 115.

The control voltage Vcnt supplied from the low pass filter 103 and the reference voltage Vref are input into the comparator 111. The comparator 111 outputs a high level signal when the control voltage Vcnt is higher than the reference voltage Vref, and outputs a low level signal when the control voltage Vcnt is lower than the reference voltage Vref. That is, the comparator 111 compares the control voltage Vcnt received from the generation unit 20 with the reference voltage Vref, and outputs a voltage error signal according to a result of the comparison.

The voltage error signal output from the comparator 111 is input into the flip-flop 112, and the flip-flop 112 temporarily holds (stores) the voltage error signal, synchronizing with a reference clock "Clock".

According to the voltage error signal output from the flip-flop 112, the up/down counter 113 changes a held digital control value, and holds the changed digital control value. Note that, in an initial state, the up/down counter 113 holds an initial digital control value.

Specifically, when the voltage error signal indicates that the control voltage Vcnt is higher than the reference voltage Vref, that is, when the voltage error signal is a high-level signal, the up/down counter 113 increments the held digital control value. The up/down counter 113 holds the digital control value that has been incremented.

When the voltage error signal indicates that the control voltage Vcnt is lower than the reference voltage Vref, that is, when the voltage error signal is a low-level signal, the up/down counter 113 decrements the held digital control value. The up/down counter 113 holds the digital control value that has been decremented.

The D/A converter 114 receives the changed digital control value from the up/down counter 113. The D/A converter 114 generates an analog control value by performing D/A conversion of the received digital control value.

The analog control value output from the D/A converter 114 is input into the gate of the MOS transistor 115, the source thereof is connected to a ground voltage, and the drain thereof is connected to the source 1061*i* of the NMOS transistor 1065*i*.

Specifically, when the analog control value corresponding to the digital control value that has been incremented is input into the gate of the MOS transistor 115, the equivalent resistance thereof becomes low, that is, the mutual conductance gm thereof becomes high (increases). Accordingly, the MOS transistor 115 increases the magnitude of the current supplied to the source 1061*i* of the NMOS transistor 1065*i*.

When the analog control value corresponding to the digital control value that has been decremented is input into the gate of the MOS transistor 115, the equivalent resistance thereof becomes high, that is, the mutual conductance gm thereof becomes low (decreases). Accordingly, the MOS transistor 115 reduces the magnitude of the current supplied to the source 1061*i* of the NMOS transistor 1065*i*.

Although the mutual conductance gm of the NMOS transistor 1065*i* can be continuously controlled based on the analog voltage input into the gate terminal thereof, the analog control value output from the D/A converter 114 is a discrete value. Therefore, by sufficiently increasing the resolution of the D/A converter 114, it is possible to continuously control the gain of the voltage-controlled oscillator 106*i* to such an extent that practical problems can be avoided.

An operation in the case where the gain of the voltage-controlled oscillator 106*i* during a gain-correcting operation corresponds to that at the time of TYP conditions (the case of the gain shown in FIG. 2: TYP) is described.

When performing this gain-correcting operation, the first control switch 104 is put into the OFF state, and the second control switch 105 is put into the ON state. Here, the up/down counter 113 outputs an initial digital control value to the D/A converter 114. The D/A converter 114 generates an initial analog control value by performing D/A conversion of the initial digital control value. As a result, a voltage according to the initial analog control value is input into the gate of the MOS transistor 115 for correcting the gain. Accordingly, the gm value of the MOS transistor 115 for correcting the gain becomes a fixed value (initial value), and an initial gain of the voltage-controlled oscillator 106*i* is set using this gm value and the resistance of the load element 1066*i*. Under TYP conditions, when the reference voltage Vref is input into the voltage-controlled oscillator 106*i*, this initial gain is set such that an oscillation frequency becomes ft. With the gain under TYP conditions, since the control voltage Vcnt of the low pass filter 103 is almost the same as the reference voltage Vref, the comparator 111 repeatedly outputs a high-level signal and a low-level signal at the same rate. Therefore, the up/down counter 113 repeatedly increments and decrements based on an initial value as a center value, and when the values are averaged, the resulting value is the same as the initial value. Consequently, the gain of the voltage-controlled oscillator 106*i* does not change from the initial gain.

An operation in the case where the gain of the voltage-controlled oscillator 106*i* during a gain-correcting operation is higher than that at the time of TYP conditions (the case of the gain shown in FIG. 2: HIGH) is described.

Here, since the reference voltage Vref is input into the voltage-controlled oscillator 106i, an oscillation frequency is fh higher than the reference value ft (see FIG. 2). At this time, the control voltage Vcnt output from the low pass filter 103 is a voltage lower than the reference voltage Vref. Consequently, the comparator 111 outputs a low-level signal to the flip-flop 112. The flip-flop 112 outputs a low-level signal to the up/down counter 113, synchronizing with the reference clock "Clock". Therefore, the up/down counter 113 decrements a held digital control value (for example, the initial digital control value). Thereafter, the D/A converter 114 performs D/A conversion of the value counted by the up/down counter 113 at an appropriate time. As for the MOS transistor 115 for correcting the gain, since the gate voltage thereof becomes lower relative to an initial voltage value at this time, its gm value becomes smaller. Here, the gain of the voltage-controlled oscillator 106i is set based on a parallel resistance value of a bias current-setting resistance and the gm value. This parallel resistance value becomes larger, and the gain of the voltage-controlled oscillator 106i lowers as a result. Therefore, the oscillation frequency of the voltage-controlled oscillator 106i is lowered, and the control voltage Vcnt becomes closer to the reference voltage Vref. This operation is repeated so that the control voltage Vcnt matches the reference voltage Vref, thereby enabling the gain to match the gain at the time of TYP conditions.

An operation in the case where the gain of the voltage-controlled oscillator 106i during a gain-correcting operation is lower than that at the time of TYP conditions (the case of the gain shown in FIG. 2 LOW) is described.

Here, the oscillation frequency is fl lower than the reference value ft. At this time, the control voltage Vcnt is higher than the reference voltage Vref. Accordingly, the comparator 111 outputs a high-level signal, and the flip-flop 112 outputs a high-level signal synchronizing with the reference clock "Clock". Therefore, the up/down counter 113 increments a held digital control value (for example, the initial digital control value). The gate voltage of the MOS transistor 115 for correcting the gain after D/A conversion becomes higher relative to an initial voltage value. As a result, the gm value of the MOS transistor 115 becomes larger, and the gain of the voltage-controlled oscillator 106i rises. This operation is repeated, thereby enabling a gain to mach the gain at the time of TYP conditions.

Figure 4:
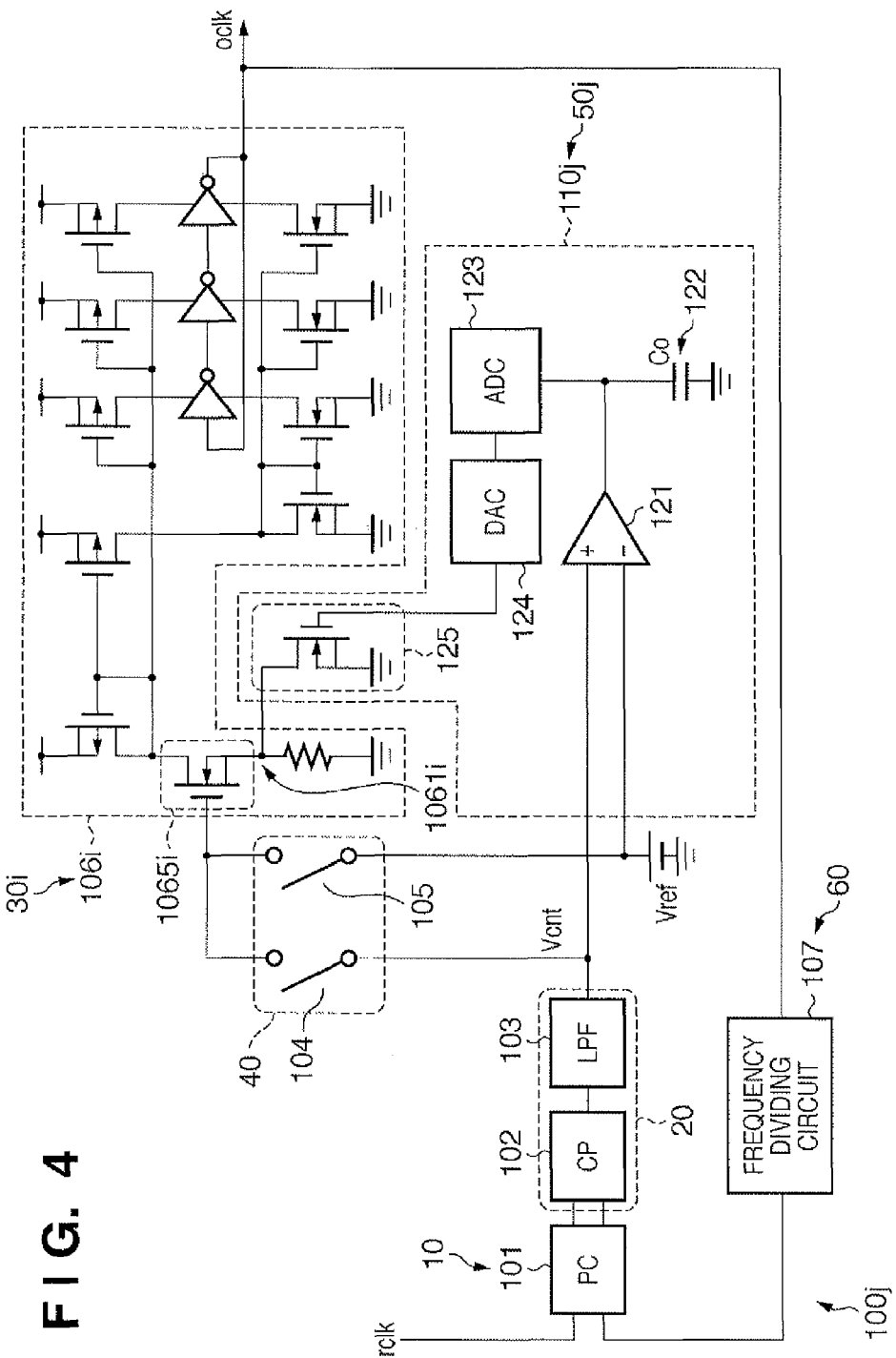
FIG. 4 is a diagram showing the configuration of a PLL circuit 100j according to a third embodiment of the present invention.

A PLL circuit 100j according to a third embodiment of the present invention is described with reference to FIG. 4. FIG. 4 is a diagram showing the configuration of the PLL circuit 100j according to the third embodiment of the present invention. Below, a description is given with emphasis on the aspects that differ from those in the second embodiment.

The PLL circuit 100j comprises a correction unit 50j.

The correction unit 50j includes a gain correction circuit 110j. The gain correction circuit 110j includes an operational amplifier (differential amplifier) 121, a holding capacitance (holding unit) 122, an A/D converter (A/D conversion unit) 123, a D/A converter 124, and a MOS transistor 125.

The control voltage Vcnt output from the low pass filter 103 is input into the positive side input terminal of the operational amplifier 121, and the reference voltage Vref is input into the negative side input terminal thereof. Here, the operational amplifier 121 is a transconductance amplifier that outputs a current with respect to an input difference voltage. The holding capacitance 122 is connected to the output terminal of the operational amplifier 121. Consequently, the operational amplifier 121 generates a differential signal between the control voltage Vcnt received from the generation unit 20 and the reference voltage Vref, and outputs the generated differential signal to the holding capacitance 122.

Specifically, the operational amplifier 121 charges the holding capacitance 122 with a current when outputting a differential signal indicating that the control voltage Vcnt is higher than the reference voltage Vref so as to increase a differential voltage held by the holding capacitance 122, and causes the holding capacitance 122 to hold the increased differential voltage.

The operational amplifier 121 discharges the holding capacitance 122 with a current when outputting a differential signal indicating that the control voltage Vcnt is lower than the reference voltage Vref so as to reduce a differential voltage held by the holding capacitance 122, and causes the holding capacitance 122 to hold the reduced differential voltage.

The holding capacitance 122 temporarily holds a differential voltage according to the differential signal output from the operational amplifier 121. The holding capacitance 122 has a capacitance value Co, generates a differential voltage determined based on the capacitance value Co with respect to the received differential signal, and holds the generated voltage.

The A/D converter 123 generates a digital control value by performing A/D conversion of the differential voltage held by the holding capacitance 122.

The D/A converter 124 generates an analog control value by performing D/A conversion of the digital control value generated by the A/D converter 123.

The analog control value output from the D/A converter 124 is input into the gate of the MOS transistor 125, the source thereof is connected to a ground voltage, and the drain thereof is connected to the source 1061i of the NMOS transistor 1065i.

Specifically, when an analog control value corresponding to the increased differential voltage is input into the gate of the MOS transistor 125, the equivalent resistance thereof becomes lower, that is, the mutual conductance gm thereof becomes higher. Consequently, the MOS transistor 125 increases the magnitude of the current supplied to the source 1061i of the NMOS transistor 1065i.

On the other hand, when an analog control value corresponding to the reduced differential voltage is input into the gate of the MOS transistor 125, the equivalent resistance thereof becomes higher, that is, the mutual conductance gm thereof becomes lower. Consequently, the MOS transistor 125 reduces the magnitude of the current supplied to the source 1061i of the NMOS transistor 1065i.

A gain-correcting operation differs from the second embodiment in the following points.

Regarding operations in the case of the gain of the voltage-controlled oscillator 106 that corresponds to that at the time of TYP conditions during a correction operation, the operational amplifier 121 performs the following operations. The operational amplifier 121 does not output a current when the control voltage Vcnt and the reference voltage Vref have equivalent voltage values. Consequently, the voltage value of the holding capacitance 122 becomes an initial value Vco. Based on this voltage value, the gain of the voltage-controlled oscillator 106 under TYP conditions is set.

When performing an operation in the case where the gain of the voltage-controlled oscillator 106 during a correction operation is higher than that at the time of TYP conditions, the reference voltage Vref has been input into the voltage-controlled oscillator 106. Accordingly, the oscillation frequency is fh higher than the reference value ft. At this time, the control voltage Vcnt is lower than the reference voltage Vref. Consequently, the operational amplifier 121 discharges the holding capacitance 122 with a current, and the voltage value of the holding capacitance 122 lowers from the initial value Vco. Thereafter, at an appropriate time, the A/D converter 123 performs A/D conversion of the voltage value of the holding capacitance 122, and the D/A converter 124 performs D/A conversion of this output signal. Since the gate voltage of the MOS transistor 125 for correcting the gain is lower relative to an initial voltage value at this time, its gm value becomes smaller. Consequently, the gain of the voltage-controlled oscillator 106 lowers. Therefore, the oscillation frequency of the voltage-controlled oscillator 106 becomes lower, and the control voltage Vcnt becomes closer to the reference voltage Vref. This operation is repeated so that the control voltage Vcnt matches the reference voltage Vref, thereby enabling a gain to match the gain at the time of TYP conditions.

When performing an operation in the case where the gain of the voltage-controlled oscillator 106 during a correction operation is lower than that at the time of TYP conditions, the oscillation frequency becomes fl lower than the reference value ft. At this time, the control voltage Vcnt is higher than the reference voltage Vref. Consequently, the operational amplifier 121 charges the holding capacitance 122 with a current, the voltage value of the holding capacitance 122 rises from the Vco voltage, and the gate voltage of the NMOS transistor for correcting the gain after D/A conversion becomes higher relative to the initial voltage value. As a result, the gm value becomes larger, and the gain of the voltage-controlled oscillator 106 rises. This operation is repeated, thereby enabling the gain to match the gain at the time of TYP conditions.

Note that, in the description of the above-mentioned embodiments, the case where a gain-correcting operation is performed once at the time of starting and, thereafter, a usual PLL circuit operation is performed is described. However, a gain-correcting operation may be performed not only once, and, for example, a correction period may be provided for the start of every operation from a standby state, or a correction period may be provided in a period that does not need the phase locking of the PLL circuit.

Furthermore, in the description of the above-mentioned embodiments, gain correction is performed by controlling the inverter driving current supplied to the ring oscillator of which the voltage-controlled oscillator is configured. However, any gain-correcting method may be used, such as a method in which gain correction is performed, for example, by controlling the power supply voltage supplied to a ring oscillator circuit based on the difference between the output voltage from the low pass filter, and the reference voltage.

Furthermore, in the description of the above-mentioned embodiments, although the voltage-controlled oscillator is configured of a ring oscillator, a voltage-controlled oscillator may have any circuit configuration.

Furthermore, in the description of the above-mentioned embodiments, the reference signal rclk is the same signal when performing a gain-correcting operation and a usual PLL circuit operation. However, the reference signal rclk may be switched according to an operating state, that is, for a gain-correcting operation, for example, correction is performed with the oscillation frequency of a crystal resonator input so as to avoid a reference signal being changed; for a usual PLL circuit operation, the reference signal to be locked is input; and so on.

Figure 5:
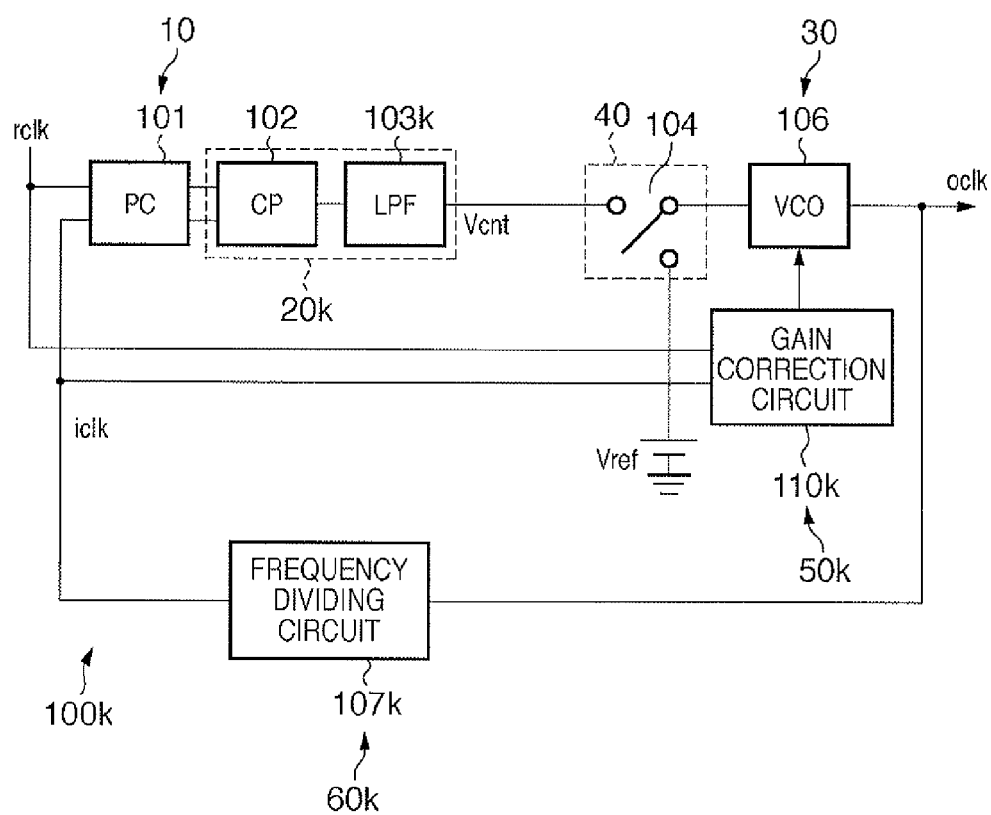
FIG. 5 is a diagram showing the configuration of a PLL circuit 100k according to a fourth embodiment of the present invention.

A PLL (Phase Locked Loop) circuit 100k according to a fourth embodiment of the present invention is described with reference to FIG. 5. FIG. 5 is a diagram showing the configuration of the PLL circuit 100k according to the fourth embodiment of the present invention. Below, a description is given with emphasis on the aspects that differ from those in the first embodiment.

The PLL circuit 100k comprises a frequency division unit 60k, a phase comparison unit 10, a generation unit 20k, a switching unit 40, an oscillation unit 30, and a correction unit 50k.

The frequency division unit 60k includes a frequency dividing circuit 107k. The frequency dividing circuit 107k divides a frequency of the internal signal oclk based on the number of frequency divisions previously designated, generates the frequency-divided signal iclk, and feeds the signal back to the phase comparison unit 10 and the correction unit 50k.

The generation unit 20k includes a charge pump circuit (CP) 102 and a low pass filter (LPF) 103k.

The low pass filter 103k outputs the generated control voltage Vcnt to the switching unit 40.

When the switching unit 40 switches to the second state, the correction unit 50k corrects the gain of the oscillation unit 30 such that the frequency of the frequency-divided signal iclk is equivalent to the frequency of the reference signal rclk. Here, the gain is a property of the frequency at which the oscillation unit 30 oscillates with respect to a voltage input into the oscillation unit 30. The correction unit 50k includes a gain correction circuit 110k.

The gain correction circuit 110k receives the reference signal rclk from the outside, and receives the frequency-divided signal iclk from the frequency division unit 60k. The gain correction circuit 110k continuously corrects the gain of the oscillation unit 30 by comparing the received frequency-divided signal iclk with the received reference signal rclk.

Specifically, when the frequency of the frequency-divided signal iclk is lower than the frequency of the reference signal rclk, the gain correction circuit 110k corrects the gain of the oscillation unit 30 such that the gain of the oscillation unit 30 rises. That is, when the oscillation frequency fo of the oscillation unit 30 is lower than the reference value (for example, fl<ft shown in FIG. 2), the gain correction circuit 110k corrects the gain of the oscillation unit 30 such that the gain of the oscillation unit 30 rises.

When the frequency of the frequency-divided signal iclk is higher than the frequency of the reference signal rclk, the gain correction circuit 110k corrects the gain of the oscillation unit 30 such that the gain of the oscillation unit 30 lowers. That is, when the oscillation frequency fo of the oscillation unit 30 is higher than the reference value (for example, fh>ft shown in FIG. 2), the gain correction circuit 110k corrects the gain of the oscillation unit 30 such that the gain of the oscillation unit 30 lowers.

When the switching unit 40 switches to the first state, the voltage-controlled oscillator 106 receives the control voltage Vcnt output from the generation unit 20. The voltage-controlled oscillator 106 generates the internal signal oclk by oscillating at the frequency fo according to the corrected gain with respect to the received control voltage Vcnt. The voltage-controlled oscillator 106 outputs the internal signal oclk to the frequency division unit 60k as well as to the outside.

In this way, in the state where the reference voltage Vref is input, the gain of the voltage-controlled oscillator 106 is continuously corrected such that the frequency of the frequency-divided signal iclk is equivalent to the frequency of the reference signal rclk. Consequently, in the second state, the gain property of the voltage-controlled oscillator 106 can be a desired property according to the reference voltage Vref.

The gain of the voltage-controlled oscillator 106 is corrected so as to generate an internal signal oclk for the frequency division unit 60k to output the frequency-divided signal iclk whose frequency is equivalent to that of the reference signal rclk in a state where the reference voltage Vref is input in the second state. Therefore, in the first state after the gain of the voltage-controlled oscillator 106 in the second state has been corrected, the frequency-divided signal whose frequency is the same as that in the second state can be input into the phase comparison unit 10. Consequently, in the state after correction has been performed, the PLL circuit operates based on the desired property according to the reference voltage Vref.

That is, the PLL property of a PLL circuit can be a desired property according to the reference voltage.

Figure 6:
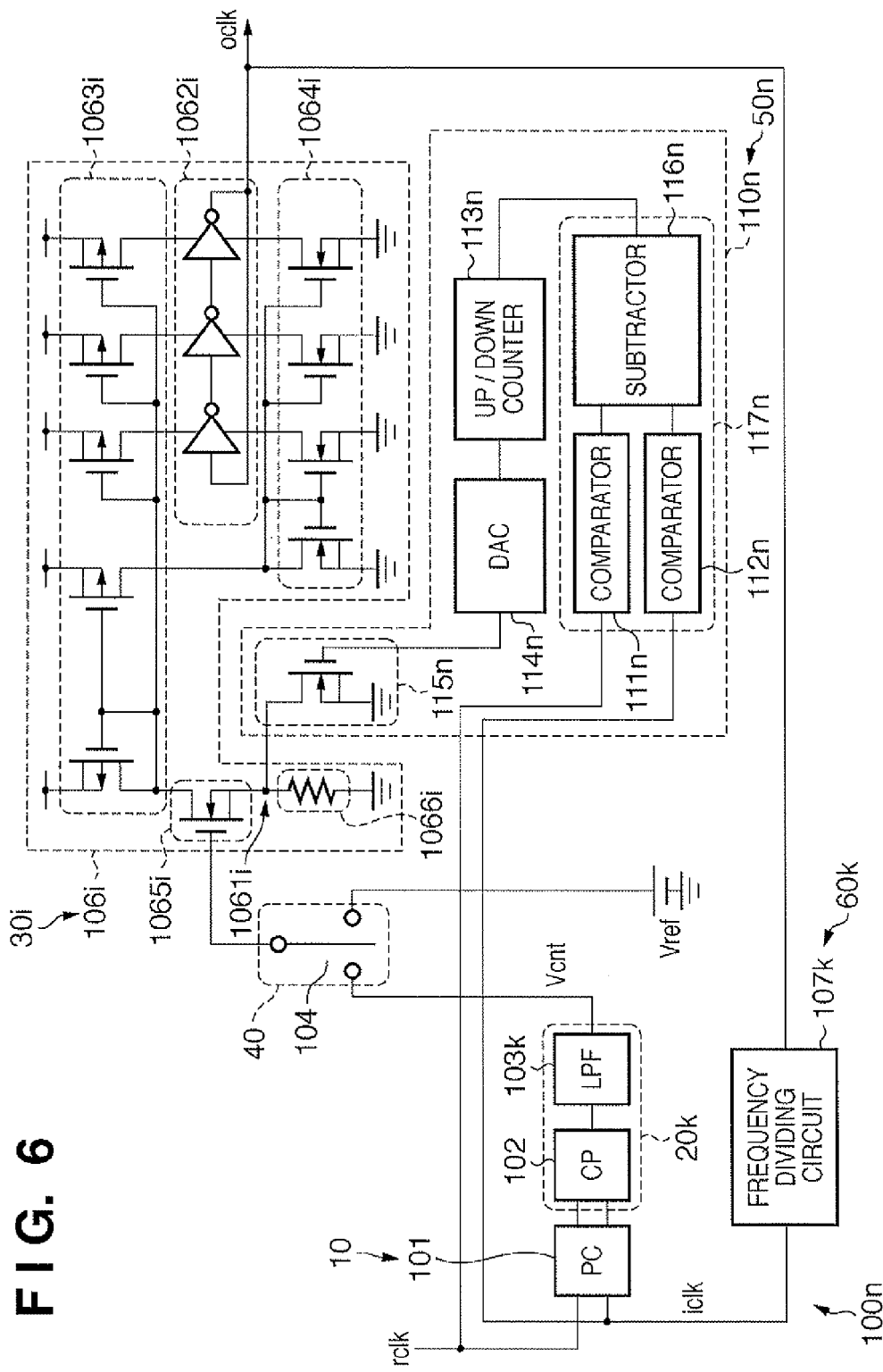
FIG. 6 is a diagram showing the configuration of a PLL circuit 100n according to a fifth embodiment of the present invention.

A PLL circuit 100n according to a fifth embodiment of the present invention is described with reference to FIG. 6. FIG. 6 is a diagram showing the configuration of the PLL circuit 100n according to the fifth embodiment of the present invention. Below, a description is given with emphasis on the aspects that differ from those in the first and fourth embodiments.

The PLL circuit 100n comprises a correction unit 50n.

The correction unit 50n includes a gain correction circuit 110n. The gain correction circuit 110n includes a frequency comparison unit 117n, an up/down counter (control value holding unit) 113n, a D/A converter (DAC, D/A conversion unit) 114n, and a MOS transistor 115n.

The frequency-divided signal iclk supplied from the frequency dividing circuit 107k and the reference signal rclk supplied from the outside are input into the frequency comparison unit 117n. The frequency comparison unit 117n outputs a difference value having a negative sign when the frequency of the frequency-divided signal iclk is higher relative to the frequency of the reference signal rclk, and the frequency comparison unit 117n outputs a difference value having a positive sign when the frequency of the frequency-divided signal iclk is lower relative to the frequency of the reference signal rclk. That is, the frequency comparison unit 117n compares the frequency-divided signal iclk supplied from the frequency dividing circuit 107k with the reference signal rclk supplied from the outside, and outputs a difference signal according to a result of the comparison.

Specifically, the frequency comparison unit 117n includes a first counter 112n, a second counter 111n, and a subtractor 116n.

The first counter 112n receives the frequency-divided signal iclk from the frequency dividing circuit 107k of the frequency division unit 60k. The first counter 112n calculates the frequency of the frequency-divided signal iclk by counting the number of clocks of the received frequency-divided signal iclk.

The second counter 111n receives the reference signal rclk supplied from the outside. The second counter 111n calculates the frequency of the reference signal rclk by counting the number of clocks of the received reference signal rclk.

The subtractor 116n receives a value counted by the first counter 112n from the first counter 112n, and receives a value counted by the second counter 111n from the second counter 111n. The subtractor 116n generates and outputs a difference signal by subtracting the value counted by the first counter 112n from the value counted by the second counter 111n. For example, the subtractor 116n outputs a difference value having the negative sign as a difference signal when the frequency of the frequency-divided signal iclk is higher relative to the frequency of the reference signal rclk. The subtractor 116n outputs a difference value having the positive sign as a difference signal when the frequency of the frequency-divided signal iclk is lower relative to the frequency of the reference signal rclk.

According to the difference signal output from the frequency comparison unit 117n, the up/down counter 113n changes a held digital control value synchronizing with a reference clock, and holds the changed digital control value. Note that the up/down counter 113n holds an initial digital control value in an initial state, increments or decrements from this initial value at the first time and, after that, increments or decrements from the last counted value.

Specifically, when the difference signal indicates that the frequency of the frequency-divided signal iclk is lower than the frequency of the reference signal rclk, that is, when the difference signal has the positive sign, the up/down counter 113n performs the following operations. The up/down counter 113n increments the held digital control value for a value according to the absolute value of the difference signal. The up/down counter 113n holds the digital control value that has been incremented.

When the difference signal indicates that the frequency of the frequency-divided signal iclk is higher than the frequency of the reference signal rclk, that is, when the difference signal has the negative sign, the up/down counter 113n performs the following operations. The up/down counter 113n decrements the held digital control value for the value according to the absolute value of the difference signal. The up/down counter 113n holds the digital control value that has been decremented.

The D/A converter 114n receives the changed digital control value from the up/down counter 113n. The D/A converter 114n generates an analog control value by performing D/A conversion of the received digital control value.

The analog control value output from the D/A converter 114n is input into the gate of the MOS transistor 115n, the source thereof is connected to a ground voltage, and the drain thereof is connected to the source 1061i of the NMOS transistor 1065i.

An operation in the case where the gain of the voltage-controlled oscillator 106i corresponds to that at the time of TYP conditions during a gain-correcting operation (the case of the gain shown in FIG. 2: TYP) is described.

Here, the control switch 104 turns off to disestablish the conduction between the generation unit 20k and the oscillation unit 30i, and turns on to establish the conduction of the reference voltage Vref to the oscillation unit 30i. The up/down counter 113n outputs the initial digital control value to the D/A converter 114n. The D/A converter 114n generates the initial analog control value by performing D/A conversion of the initial digital control value. As a result, a voltage according to the initial analog control value is input into the gate of the MOS transistor 115n for correcting the gain. Accordingly, the gm value of the MOS transistor 115n for correcting the gain becomes a fixed value (initial value), and the initial gain of the voltage-controlled oscillator 106i is set based on this gm value and the resistance of the load element 1066i. When the reference voltage Vref is input into the voltage-controlled oscillator 106i under TYP conditions, this initial gain is set such that the oscillation frequency becomes ft.

Since the reference voltage Vref is input at this time, the voltage-controlled oscillator 106i outputs the internal signal oclk having the fixed oscillation frequency fo. The first counter 112n counts the number of clocks of the signal (iclk) obtained by dividing a frequency of this internal signal oclk in the frequency dividing circuit 107. Also, concurrently with this, the second counter 111n counts the number of clocks of the reference signal rclk. When the gain corresponds to that under TYP conditions, the oscillation frequency ft of the voltage-controlled oscillator 106i is a frequency obtained by multiplying the frequency of the reference signal rclk by the number of frequency divisions performed by the frequency dividing circuit 107. Consequently, the values counted by the second counter 111n and the first counter 112n, which counted for the same time period, are equivalent. Accordingly, the digital control value held by the up/down counter 113n according to the difference signal output from the subtractor 116n does not change from the initial digital control value; therefore, the gain of the voltage-controlled oscillator 106i does not change from the initial gain.

Although the mutual conductance gm of the NMOS transistor 1065i can be continuously controlled based on the analog voltage input into the gate terminal thereof, the analog control value output from the D/A converter 114n is a discrete value. Therefore, by sufficiently increasing the resolution of the D/A converter 114n, it is possible to continuously control the gain of the voltage-controlled oscillator 106i to such an extent that practical problems can be avoided.

An operation in the case where the gain of the voltage-controlled oscillator 106i during a gain-correcting operation is higher than that at the time of TYP conditions (the case of the gain shown in FIG. 2: HIGH) is described.

Here, since the reference voltage Vref is input into the voltage-controlled oscillator 106i, the oscillation frequency is fh higher than the reference value ft (see FIG. 2). At this time, when a count operation is performed for an equal period of time, the value counted by the first counter 112n is larger than the value counted by the second counter 111n. Accordingly, the difference value having the negative sign is output from the subtractor 116n to the up/down counter 113n. As a result, the up/down counter 113n decrements the held digital control value (for example, the initial digital control value) according to the received difference value, synchronizing with a reference clock. Thereafter, the D/A converter 114n performs D/A conversion of the value counted by the up/down counter 113n at an appropriate time. At this time, the gm value of the MOS transistor 115n for correcting the gain becomes smaller since the gate voltage thereof becomes lower relative to the initial voltage value. Here, the gain of the voltage-controlled oscillator 106i is set based on a parallel resistance value of the bias current-setting resistance and the gm value. This parallel resistance value becomes larger, and the gain of the voltage-controlled oscillator 106i lowers as a result. Thereafter, the numbers counted by the first counter 112n and the second counter 111n are reset. Since the oscillation frequency of the voltage-controlled oscillator 106i has lowered, by performing a count operation for an equal period of time, the value counted by the first counter 112n gets closer to the value counted by the second counter 111n compared with the value before correction. This operation is repeated so that the frequency of the frequency-divided signal iclk matches the frequency of the reference signal rclk, thereby enabling a gain to match the gain at the time of TYP conditions.

An operation in the case where the gain of the voltage-controlled oscillator 106i during a gain-correcting operation is lower than that at the time of TYP conditions (the case of the gain shown in FIG. 2: LOW) is described.

Here, the oscillation frequency of the voltage-controlled oscillator 106i becomes fl lower than the reference value ft. At this time, when a count operation is performed for an equal period of time, the value counted by the first counter 112n becomes smaller than the value counted by the second counter 111n. Accordingly, the difference value having the positive sign is output from the subtractor 116n to the up/down counter 113n. The up/down counter 113n increments the held digital control value (for example, the initial digital control value). The gate voltage of the MOS transistor 115n for correcting the gain after D/A conversion becomes higher relative to the initial voltage value. As a result, the gm value of the MOS transistor 115n becomes larger, and the gain of the voltage-controlled oscillator 106i rises. Thereafter, the numbers counted by the first counter 112n and the second counter 111n are reset. Since the oscillation frequency of the voltage-controlled oscillator 106i has risen, by performing a count operation for an equal period of time, the value counted by the first counter 112n gets closer to the value counted by the second counter 111n compared with the value before correction. This operation is repeated, thereby enabling a gain to mach the gain at the time of TYP conditions.

Figure 7:
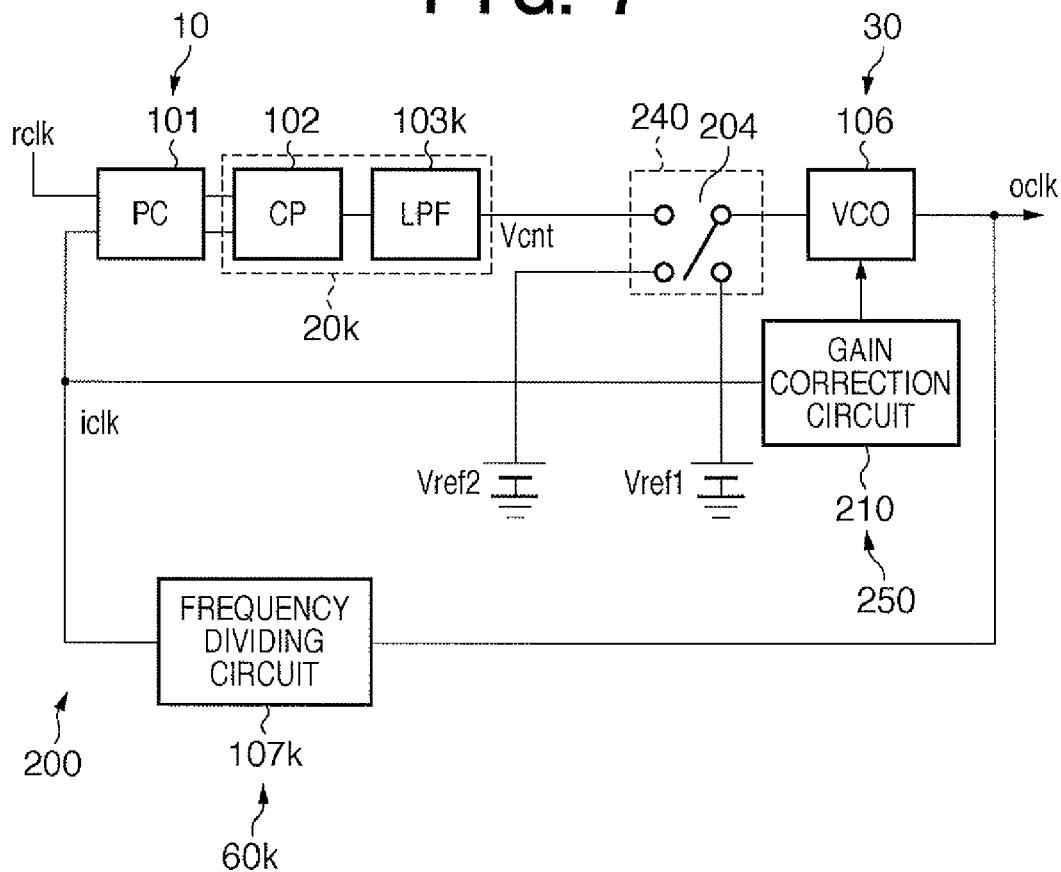
FIG. 7 is a diagram showing the configuration of a PLL circuit 200 according to a sixth embodiment of the present invention.

A PLL circuit 200 according to a sixth embodiment of the present invention is described with reference to FIG. 7. FIG. 7 is a diagram showing the configuration of the PLL circuit 200 according to the sixth embodiment of the present invention. Below, a description is given with emphasis on the aspects that differ from those in the fourth embodiment.

The PLL circuit 200 comprises a switching unit 240 and a correction unit 250.

The switching unit 240 switches between a first state, a third state, and a fourth state. The first state is a state where the control voltage output from the generation unit 20k is input into the oscillation unit 30. The third state is a state where a first reference voltage Vref1 is input into the oscillation unit 30. The fourth state is a state where a second reference voltage Vref2 is input into the oscillation unit 30. The second reference voltage Vref2 is higher than the first reference voltage Vref1. The switching unit 240 includes a control switch 204.

The control switch 204 includes a first control switch (not shown), a third control switch (not shown), and a fourth control switch (not shown). The first control switch turns on/off to establish/disestablish the conduction between the generation unit 20k and the oscillation unit 30. The third control switch turns on/off to establish/disestablish the conduction of the first reference voltage Vref1 to the oscillation unit 30. The fourth control switch turns on/off to establish/disestablish the conduction of the second reference voltage Vref2 to the oscillation unit 30. Accordingly, the switching unit 240 switches to the first state by causing the first control switch to turn on, and causing the third and fourth control switches to turn off. The switching unit 240 switches to the third state by causing the first control switch to turn off, causing the third control switch to turn on, and causing the fourth control switch to turn off. The switching unit 240 switches to the fourth state by causing the first and third control switches to turn off and causing the fourth control switch to turn on.

The correction unit 250 corrects the gain of the oscillation unit 30 such that the absolute value of the frequency difference is equivalent to a desired value. Here, the frequency difference is a difference between the frequency of the frequency-divided signal iclk at the time when the switching unit 240 switches to the third state, and the frequency of the frequency-divided signal iclk at the time when the switching unit 240 switches to the fourth state. The correction unit 250 includes a gain correction circuit 210.

The gain correction circuit 210 receives the frequency-divided signal iclk from the frequency division unit 60k. The gain correction circuit 210 does not receive the reference signal rclk supplied from the outside.

The gain correction circuit 210 corrects the gain of the oscillation unit 30 by comparing the absolute value of the frequency difference between the frequency of the frequency-divided signal iclk in the third state and the frequency of the frequency-divided signal iclk in the fourth state, with a desired value.

Specifically, the gain correction circuit 210 corrects the gain of the oscillation unit 30 such that the gain of the oscillation unit 30 rises when the absolute value of the frequency difference is smaller than the desired value. That is, the gain correction circuit 210 corrects the gain of the oscillation unit 30 such that the gain of the oscillation unit 30 rises when the oscillation frequency fo of the oscillation unit 30 is lower than the reference value (for example, (fl2−fl1)<(ft2−ft1) shown in FIG. 8).

The gain correction circuit 210 corrects the gain of the oscillation unit 30 such that the gain of the oscillation unit 30 lowers when the absolute value of the frequency difference is larger than the desired value. That is, the gain correction circuit 210 corrects the gain of the oscillation unit 30 such that the gain of the oscillation unit 30 lowers when the oscillation frequency fo of the oscillation unit 30 is higher than the reference value (for example, (fh2−fh1)>(ft2−ft1) shown in FIG. 8).

Figure 8:
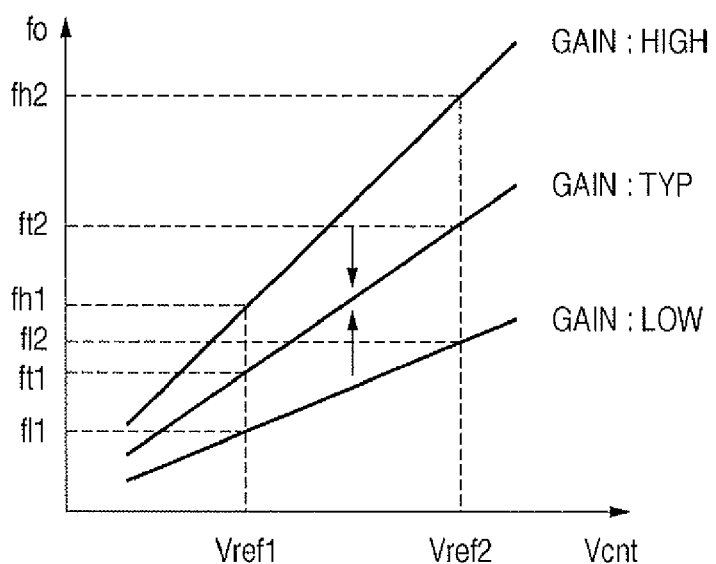
FIG. 8 is a diagram showing example gain properties of the voltage-controlled oscillator 106 in the sixth embodiment of the present invention.

A gain-correcting operation performed by the gain correction circuit 210 is described with reference to FIG. 8. FIG. 8 is a diagram showing an example gain property of the frequency fo of the internal signal oclk with respect to the control voltage Vcnt of the voltage-controlled oscillator 106 in the sixth embodiment of the present invention.

FIG. 8 shows that the oscillation frequency is ft1 when the control voltage Vcnt is equivalent to the first reference voltage Vref1 in the case where the gain of the voltage-controlled oscillator 106 corresponds to that under TYP conditions. FIG. 8 shows that the oscillation frequency is ft2 when the control voltage Vcnt is equivalent to the first reference voltage Vref2 in the case where the gain of the voltage-controlled oscillator 106 corresponds to that under TYP conditions. In this case, the absolute value of the frequency difference (ft2−ft1) is the desired value (target value).

In the case of a HIGH condition in which the gain of the voltage-controlled oscillator 106 is high due to changes in power supply voltages or variations in manufacturing processes, when the first reference voltage Vref1 is input into the voltage-controlled oscillator 106, the oscillation frequency becomes fh1 higher than the reference value ft1. The oscillation frequency will become fh2 higher than the reference value ft2 when the second reference voltage Vref2 is input into the voltage-controlled oscillator 106. In this case, the absolute value of the frequency difference (fh2−fh1) is larger than the desired value (ft2−ft1).

In the case of a LOW condition where the gain of the voltage-controlled oscillator 106 is low, when the first reference voltage Vref1 is input into the voltage-controlled oscillator 106, the oscillation frequency becomes fl1 lower than the reference value ft1. The oscillation frequency will become fl2 lower than the reference value ft2 when the second reference voltage Vref2 is input into the voltage-controlled oscillator 106. In this case, the absolute value of the frequency difference (fl2−fl1) is smaller than the desired value (ft2−ft1).

In the PLL circuit according to this embodiment, a gain-correcting operation for correcting the gain such that the gain property of the voltage-controlled oscillator 106 corresponds to the gain property under TYP conditions differs from that of the fourth embodiment in the following points.

In the case of the HIGH condition where the gain of the voltage-controlled oscillator 106 is higher than the reference value, the absolute value of the frequency difference (fh2−fh1) is larger than the desired value (ft2−ft1) as described above. Accordingly, the gain correction circuit 210 performs an operation for lowering the oscillation frequency; thus, the absolute value of the frequency difference is lowered so as to be closer to the desired value (ft2−ft1) from a value higher than the desired value (ft2−ft1).

On the other hand, in the case of the LOW condition where the gain of the voltage-controlled oscillator 106 is lower than the reference value, as described above, the absolute value of the frequency difference (fh2−fh1) is smaller than the desired value (ft2−ft1). Accordingly, the gain correction circuit 210 performs an operation for raising the oscillation frequency, so that the absolute value of the frequency difference is raised so as to be closer to the desired value (ft2−ft1) from a value lower than the desired value (ft2−ft1).

In this way, the gain correction circuit 210 compares the absolute value of the frequency difference with the desired value, and corrects the gain of the voltage-controlled oscillator 106 according to the difference between the values. The gain correction circuit 210 performs this gain-correcting operation until the difference between the absolute value of the frequency difference and the desired value is eliminated, thereby enabling the gain of the voltage-controlled oscillator 106 to match the gain at the time of TYP conditions.

After performing this gain-correcting operation, the first control switch of the control switch 204 is put in the ON state, and the third and fourth control switches thereof are put into the OFF state. Accordingly, the voltage-controlled oscillator 106 that has the gain at the time of TYP conditions can perform a usual PLL circuit operation.

Therefore, also in the PLL circuit in this embodiment, even in the case where the gain of the voltage-controlled oscillator is changed due to variations in power supply voltages or manufacturing processes, the desired PLL response property can be obtained by performing gain correction.

Figure 9:
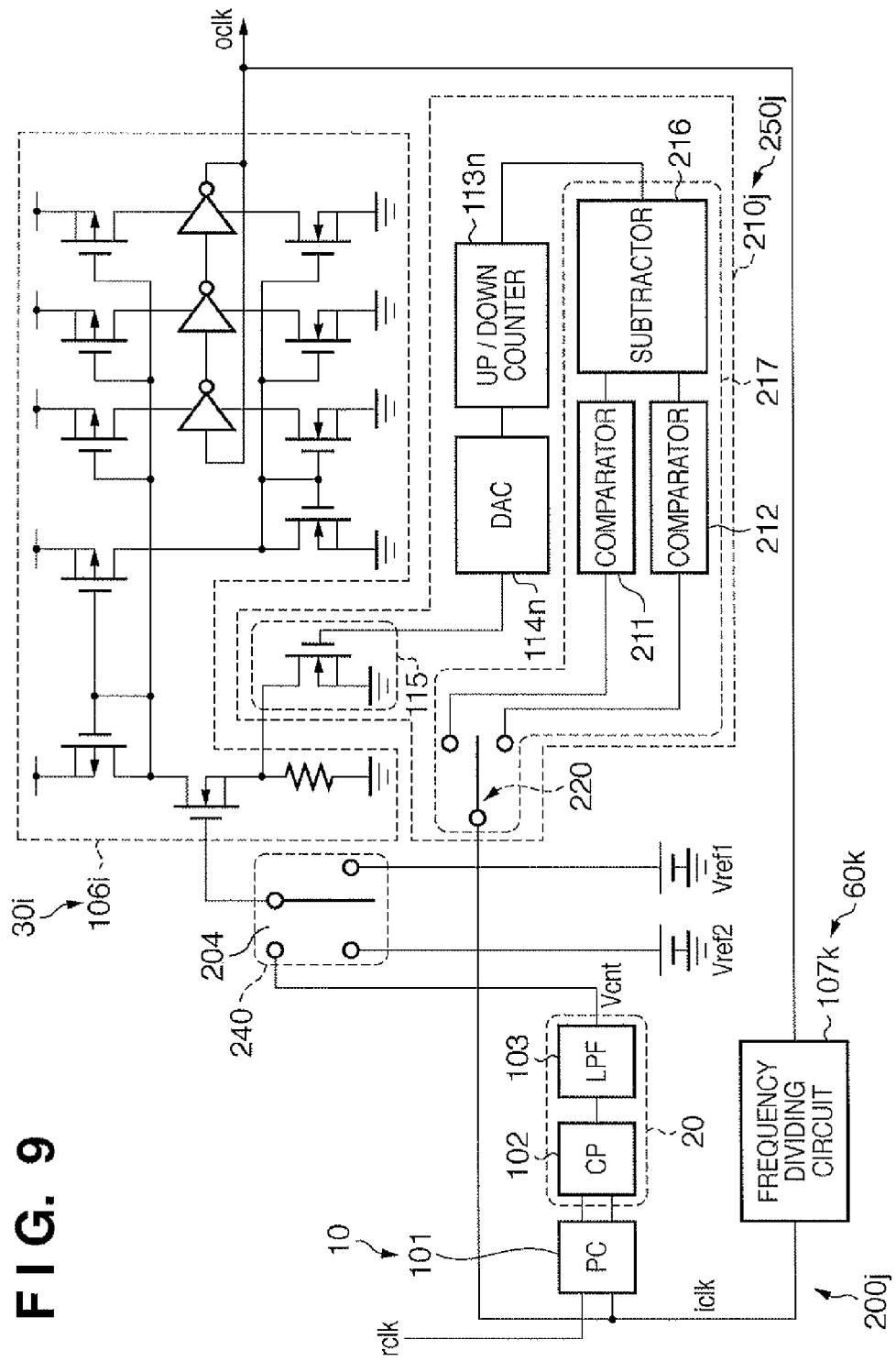
FIG. 9 is a diagram showing the configuration of a PLL circuit 200j according to a seventh embodiment of the present invention.

A PLL circuit 200j according to a seventh embodiment of the present invention is described with reference to FIG. 9. FIG. 9 is a diagram showing the configuration of the PLL circuit 200j according to the seventh embodiment of the present invention. Below, a description is given with emphasis on the aspects that differ from those in the fifth and sixth embodiments.

The PLL circuit 200j comprises a correction unit 250j.

The correction unit 250j includes a gain correction circuit 210j. The gain correction circuit 210j includes a frequency difference comparison unit 217.

When the switching unit 240 switches to the third state, the frequency difference comparison unit 217 receives and holds the frequency-divided signal iclk in the third state. When the switching unit 240 switches to the fourth state, the frequency difference comparison unit 217 receives and holds the frequency-divided signal iclk in the fourth state. The frequency difference comparison unit 217 obtains the absolute value of the frequency difference between the frequency of the frequency-divided signal iclk in the third state, and the frequency of the frequency-divided signal iclk in the fourth state. The frequency difference comparison unit 217 outputs the difference value having the negative sign when the absolute value of the frequency difference is larger relative to the desired value, and outputs the difference value having the positive sign when the absolute value of the frequency difference is smaller relative to the desired value. That is, the frequency difference comparison unit 217 compares the absolute value of the frequency difference with the desired value, and outputs the difference signal according to a result of the comparison.

Specifically, the frequency difference comparison unit 217 includes a control switch 220, a third counter 212, a fourth counter 211, and a subtractor 216.

The control switch 220 switches the input of the frequency-divided signal iclk output from the frequency dividing circuit 107k either into the third counter 212, or into the fourth counter 211.

Specifically, the control switch 220 includes a fifth control switch (not shown) and a sixth control switch (not shown). The fifth control switch turns on/off to establish/disestablish the conduction between the frequency dividing circuit 107k and the third counter 212. The sixth control switch turns/off to establish/disestablish the conduction between the frequency dividing circuit 107k and the fourth counter 211.

When the switching unit 240 switches to the third state, the control switch 220 turns the fifth control switch on, and turns the sixth control switch off. Accordingly, the control switch 220 causes the frequency-divided signal iclk at the time when the switching unit 240 switches to the third state to be input into the third counter 212.

When the switching unit 240 switches to the fourth state, the control switch 220 turns the fifth control switch off, and turns the sixth control switch on. Accordingly, the control switch 220 causes the frequency-divided signal iclk at the time of the switching unit 240 switching to the fourth state to be input into the fourth counter 211.

When the switching unit 240 switches to the third state, the third counter 212 receives the frequency-divided signal iclk from the frequency dividing circuit 107k via the control switch 220. The third counter 212 counts the number of clocks of the frequency-divided signal iclk at the time when the switching unit 240 switches to the third state. Accordingly, the third counter 212 calculates the frequency of the frequency-divided signal iclk at the time when the switching unit 240 switches to the third state. The third counter 212 is configured so as to count an input signal, for example, for a certain period of time set by a timer circuit or the like.

When the switching unit 240 switches to the fourth state, the fourth counter 211 receives the frequency-divided signal iclk from the frequency dividing circuit 107k via the control switch 220. The fourth counter 211 counts the number of clocks of the frequency-divided signal iclk at the time when the switching unit 240 switches to the fourth state. Consequently, the fourth counter 211 calculates the frequency of the frequency-divided signal iclk at the time when the switching unit 240 switches to the fourth state. The fourth counter 211 is configured so as to count an input signal, for example, for a certain period of time set by a timer circuit or the like.

The subtractor 216 receives the value counted by the third counter 212 from the third counter 212, and receives the value counted by the fourth counter 211 from the fourth counter 211. The subtractor 216 subtracts the value counted by the third counter 212 from the value counted by the fourth counter 211, and further subtracts the desired value from the subtraction result so as to generate and output the difference signal. For example, when the absolute value of the frequency difference is larger relative to the desired value, the subtractor 216 outputs a difference value having the negative sign as the difference signal. When the absolute value of the frequency difference is smaller relative to the desired value, the subtractor 216 outputs a difference value having the positive sign as the difference signal.

Accordingly, when the difference signal indicates that the absolute value of the frequency difference is smaller than the desired value, the up/down counter (control value holding unit) 113n increments the held digital control value, and holds the digital control value that has been incremented. When the difference signal indicates that the absolute value of the frequency difference is larger than the desired value, the up/down counter 113n decrements the held digital control value, and holds the digital control value that has been decremented.

Thereafter, the D/A converter 114 performs D/A conversion of the digital control value held by the up/down counter 113n, and controls the gm value of the MOS transistor 115 for correcting the gain. When the digital control value held by the up/down counter 113n is a value that has been incremented from the initial value, the gm value of the MOS transistor 115 for correcting the gain becomes large. Accordingly, the gain of the voltage-controlled oscillator 106i becomes large. When the digital control value held by the up/down counter 113n is a value that has been decremented from the initial value, the gm value of the MOS transistor 115 for correcting the gain becomes small. Accordingly, the gain of the voltage-controlled oscillator 106i becomes small.

Note that, in the description of the above-mentioned embodiments, the case where a gain-correcting operation is performed only once based on the arithmetic result of a counted value is described. However, gain correction may be performed by repeating operations in which D/A conversion of a digital control value output from the up/down counter is performed and, at the same time, each counted value is reset so as to start counting, and gain correction is performed again based on the result.

In the description of the above-mentioned embodiments, gain correction is performed by controlling the inverter driving current supplied to the ring oscillator of which the voltage-controlled oscillator 106i is configured. However, any gain-correcting method may be used, such as a method in which gain correction is performed based on the arithmetic result of a counted value, for example, by controlling the power supply voltage supplied to the ring oscillator circuit.

Although the voltage-controlled oscillator is configured of a ring oscillator in the description of the above-mentioned embodiments, a voltage-controlled oscillator may have any circuit configuration.

In the description of the above-mentioned embodiments, each counted value is subtracted, the up/down counter is caused to operate based on that value, that value is converted into an analog voltage by the D/A converter, and gain correction is performed based on this voltage. However, it is not necessary to always adopt this configuration. For example, each counted value may be converted into an analog voltage by the D/A converter, respectively, such analog voltages may be input into the operational amplifier, and gain correction may be performed based on the internal signal.

In the description of the above-mentioned embodiments, after the frequency dividing circuit divides a frequency of the internal signal from the voltage-controlled oscillator, the obtained signal is input into the phase comparator and the gain correction circuit. However, a frequency dividing circuit may not be provided, and the internal signal from the voltage-controlled oscillator may be input into the phase comparator and the gain correction circuit. A signal whose frequency has been divided by the frequency dividing circuit may be input into the phase comparator, and the internal signal from the voltage-controlled oscillator may be input into the gain correction circuit. The internal signal from the voltage-controlled oscillator may be input into the phase comparator, and the signal whose frequency has been divided by the frequency dividing circuit may be input into the gain correction circuit.

In the description of the above-mentioned embodiments, the reference signal rclk is the same signal when performing a gain-correcting operation and a usual PLL circuit operation. However, the reference signal rclk may be switched according to an operating state, that is, for a gain-correcting operation, for example, correction is performed with the oscillation frequency of a crystal resonator input so as to avoid a reference signal being changed; for a usual PLL circuit operation, the reference signal to be locked is input; and so on.

In the description of the above-mentioned embodiments, the gain correction circuit comprises two counters, and performs count operations when two reference voltages are input into a voltage-controlled oscillator, using different counters from each other. However, one counter may be provided. In that case, it is conceivable to provide a holding means that holds values counted by the counter. The operation at this time is an operation in which the holding means is caused to hold the value counted for a certain period of time when the first reference voltage Vref1 is input into the voltage-controlled oscillator, first. Thereafter, the second reference voltage Vref2 is input into the voltage-controlled oscillator after the counter has been reset, and a count operation is performed for the same period of time as when the first reference voltage Vref1 was input. Then, the subtractor obtains the difference signal between the counted value held by the holding means, and the counted value output from the counter. Note that a value counted when the second reference voltage Vref2 is input may not be directly input into the subtractor, another holding means may be caused to hold the value, and this holding means may be caused to input the value into the subtractor.

In the description, of the above-mentioned embodiments, although the gain correction circuit inputs two counted values into the subtractor, a configuration may be adopted in which a comparator is used instead of the subtractor. In this case, according to a signal indicating the size of two counted values output from the comparator, the up/down counter increments or decrements for only one count, and changes the gain of the voltage-controlled oscillator. Thereafter, a count operation is performed again after a counted value has been reset, and an operation for changing the gain of the voltage-controlled oscillator is repeated according to the signal output from the comparator.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-264634, filed Oct. 10, 2008 and Japanese Patent Application No. 2008-264635, filed Oct. 10, 2008 which are hereby incorporated by reference herein in their entirety.

What is claimed is:

1. A PLL circuit comprising:
an oscillation unit that generates an internal signal by oscillating at a frequency according to an input voltage;
a frequency division unit that divides a frequency of the internal signal so as to generate a frequency-divided signal;
a phase comparison unit that compares a phase of a reference signal input from outside with a phase of the frequency-divided signal received from the frequency division unit, and outputs a phase error signal according to a result of the comparison;
a generation unit that generates a control voltage based on the phase error signal;
a switching unit that switches between a first state in which the control voltage output from the generation unit is input into the oscillation unit and a second state in which a reference voltage is input into the oscillation unit; and
a correction unit that, in the second state, compares the control voltage output from the generation unit with the reference voltage, and corrects a frequency at which the oscillation unit oscillates with respect to a voltage input into the oscillation unit, such that the control voltage output from the generation unit is equivalent to the reference voltage, wherein the correction unit corrects a gain of the oscillation unit such that the control voltage output from the generation unit is equivalent to the reference voltage, the gain being a property of the frequency at which the oscillation unit oscillates with respect to the voltage input into the oscillation unit,
wherein the oscillation unit comprises:
an input transistor comprising a gate into which the control voltage or the reference voltage is input;
a current mirror circuit that supplies a current according to a current that flows between a source and a drain of the input transistor; and
a ring oscillator that receives the current supplied by the current mirror circuit, and oscillates at a frequency according to a magnitude of the received current, and
wherein the correction unit comprises:
a MOS transistor whose mutual conductance is controlled based on a result of the comparison of the control voltage received from the generation unit, and the reference voltage, wherein the mutual conductance of the MOS transistor decreases when the control voltage is higher than the reference voltage, and the mutual conductance of the MOS transistor increases when the control voltage is lower than the reference voltage;
a voltage comparison unit that compares the control voltage received from the generation unit with the reference voltage, and outputs a voltage error signal according to a result of the comparison;
a holding unit that temporarily holds the voltage error signal output from the voltage comparison unit;
a control value holding unit that changes a held digital control value according to the voltage error signal output from the holding unit, and holds the changed digital control value; and
a D/A conversion unit that generates an analog control value by performing D/A conversion of the changed digital control value that was output from the control value holding unit,
wherein the MOS transistor comprises a gate into which the analog control value output from the D/A conversion unit is input, a source connected to a ground voltage, and a drain connected to the source of the input transistor.

2. The PLL circuit according to claim 1,
wherein the control value holding unit increments a held digital control value and holds the digital control value that has been incremented when the voltage error signal indicates that the control voltage is higher than the reference voltage, and decrements the held digital control value and holds the digital control value that has been decremented when the voltage error signal indicates that the control voltage is lower than the reference voltage,
the MOS transistor increases the magnitude of the current that flows between the source and the drain of the input transistor when an analog control value corresponding to the digital control value that has been incremented is input into the gate, and reduces the magnitude of the current that flows between the source and the drain of the input transistor when an analog control value corresponding to the digital control value that has been decremented is input into the gate, and the gain of the oscillation unit rises when the magnitude of the current that flows between the source and the drain of the input transistor increases, and lowers when the magnitude of the current that flows between the source and the drain of the input transistor decreases.

3. A PLL circuit comprising:

an oscillation unit that generates an internal signal by oscillating at a frequency according to an input voltage;

a frequency division unit that divides a frequency of the internal signal so as to generate a frequency-divided signal;

a phase comparison unit that compares a phase of a reference signal input from outside with a phase of the frequency-divided signal received from the frequency division unit, and outputs a phase error signal according to a result of the comparison;

a generation unit that generates a control voltage based on the phase error signal;

a switching unit that switches between a first state in which the control voltage output from the generation unit is input into the oscillation unit and a second state in which a reference voltage is input into the oscillation unit; and a correction unit that, in the second state, compares the control voltage output from the generation unit with the reference voltage, and corrects a frequency at which the oscillation unit oscillates with respect to a voltage input into the oscillation unit, such that the control voltage output from the generation unit is equivalent to the reference voltage, wherein the correction unit corrects a gain of the oscillation unit such that the control voltage output from the generation unit is equivalent to the reference voltage, the gain being a property of the frequency at which the oscillation unit oscillates with respect to the voltage input into the oscillation unit, wherein the oscillation unit comprises:

an input transistor including a gate into which the control voltage or the reference voltage is input;

a current mirror circuit that supplies a current according to a current that flows between a source and a drain of the input transistor; and a ring oscillator that receives the current supplied by the current mirror circuit, and oscillates at a frequency according to a magnitude of the received current, and wherein the correction unit comprises:

a MOS transistor whose mutual conductance is controlled based on a result of the comparison of the control voltage received from the generation unit, and the reference voltage, wherein the mutual conductance of the MOS transistor decreases when the control voltage is higher than the reference voltage, and the mutual conductance of the MOS transistor increases when the control voltage is lower than the reference voltage;

a differential amplifier that generates and outputs a differential signal between the control voltage received from the generation unit and the reference voltage;

a holding unit that temporarily holds a differential voltage according to the differential signal output from the differential amplifier;

an A/D conversion unit that performs A/D conversion of the differential voltage held by the holding unit so as to generate a digital control value;

a D/A conversion unit that performs D/A conversion of the digital control value so as to generate an analog control value;

wherein the MOS transistor comprises a gate into which the analog control value output from the D/A conversion unit is input, a source connected to a ground voltage, and a drain connected to the source of the input transistor.

4. The PLL circuit according to claim 3, wherein the differential amplifier increases the differential voltage held by the holding unit and causes the holding unit to hold the increased differential voltage when outputting the differential signal indicating that the control voltage is higher than the reference voltage, and reduces the differential voltage held by the holding unit and causes the holding unit to hold the reduced differential voltage when outputting the differential signal indicating that the control voltage is lower than the reference voltage, the MOS transistor increases the magnitude of a current that flows between the source and the drain of the input transistor when an analog control value corresponding to the increased differential voltage is input into the gate, and reduces the magnitude of the current that flows between the source and the drain of the input transistor when an analog control value corresponding to the reduced differential voltage is input into the gate, and the gain of the oscillation unit rises when the magnitude of the current that flows between the source and the drain of the input transistor increases, and lowers when the magnitude of the current that flows between the source and the drain of the input transistor decreases.

5. A PLL circuit comprising:

an oscillation unit that generates an internal signal by oscillating at a frequency according to an input voltage;

a frequency division unit that divides a frequency of the internal signal so as to generate a frequency-divided signal;

a phase comparison unit that compares a phase of a reference signal input from outside with a phase of the frequency-divided signal received from the frequency division unit, and outputs a phase error signal according to a result of the comparison;

a generation unit that generates a control voltage based on the phase error signal;

a switching unit that switches between a first state in which the control voltage output from the generation unit is input into the oscillation unit and a second state in which a reference voltage is input into the oscillation unit; and a correction unit that, in the second state, compares a frequency of the frequency-divided signal with a frequency of the reference signal, and corrects a frequency at which the oscillation unit oscillates with respect to a voltage input into the oscillation unit, such that the frequency of the frequency-divided signal is equivalent to the frequency of the reference signal, wherein the correction unit corrects a gain of the oscillation unit such that the frequency of the frequency-divided signal is equivalent to the frequency of the reference signal, the gain being a property of the frequency at which the oscillation unit oscillates with respect to the voltage input into the oscillation unit, wherein the oscillation unit comprises:

an input transistor comprising a gate into which the control voltage or the reference voltage is input;

a current mirror circuit that supplies a current according to a current that flows between a source and a drain of the input transistor; and a ring oscillator that receives the current supplied by the current mirror circuit, and oscillates at a frequency according to a magnitude of the received current, and wherein the correction unit comprises:
a MOS transistor whose mutual conductance is controlled based on a result of the comparison of the frequency of the reference signal and the frequency of the frequency-divided signal, wherein the mutual conductance of the MOS transistor decreases when the frequency of the frequency-divided signal is higher than the frequency of the reference signal, and the mutual conductance of the MOS transistor increases when the frequency of the frequency-divided signal is lower than the frequency of the reference signal;
a frequency comparison unit that compares the frequency of the frequency-divided signal received from the frequency division unit with the frequency of the reference signal received from the outside, and outputs a difference signal according to a result of the comparison;
a control value holding unit that changes a held digital control value according to the difference signal output from the frequency comparison unit, and holds the changed digital control value;
a D/A conversion unit that generates an analog control value by performing D/A conversion of the changed digital control value that was output from the control value holding unit;
wherein the MOS transistor comprises a gate into which the analog control value output from the D/A conversion unit is input, a source connected to a reference voltage, and a drain connected to the source of the input transistor.

6. The PLL circuit according to claim 5, wherein the frequency comparison unit comprises:
a first counter that calculates the frequency of the frequency-divided signal by counting a number of clocks of the frequency-divided signal received from the frequency division unit;
a second counter that calculates the frequency of the reference signal by counting a number of clocks of the reference signal received from the outside; and
a subtractor that generates and outputs a difference signal by subtracting a value counted by the first counter from a value counted by the second counter.

7. The PLL circuit according to claim 5,
wherein the control value holding unit increments the held digital control value and holds the digital control value that has been incremented when the difference signal indicates that the frequency of the frequency-divided signal is lower than the frequency of the reference signal, and decrements the held digital control value and holds the digital control value that has been decremented when the difference signal indicates that the frequency of the frequency-divided signal is higher than the frequency of the reference signal,
the MOS transistor increases the magnitude of the current that flows between the source and the drain of the input transistor when an analog control value corresponding to the digital control value that has been incremented is input into the gate, and reduces the magnitude of the current that flows between the source and the drain of the input transistor when an analog control value corresponding to the digital control value that has been decremented is input into the gate, and
the gain of the oscillation unit rises when the magnitude of the current that flows between the source and the drain of the input transistor increases, and lowers when the magnitude of the current that flows between the source and the drain of the input transistor decreases.

8. A PLL circuit comprising:
an oscillation unit that generates an internal signal by oscillating at a frequency according to an input voltage;
a frequency division unit that divides a frequency of the internal signal so as to generate a frequency-divided signal;
a phase comparison unit that compares a phase of a reference signal input from outside with a phase of the frequency-divided signal received from the frequency division unit, and outputs a phase error signal according to a result of the comparison;
a generation unit that generates a control voltage based on the phase error signal;
a switching unit that switches between a first state in which the control voltage output from the generation unit is input into the oscillation unit, a third state in which a first reference voltage is input into the oscillation unit, and a fourth state in which a second reference voltage higher than the first reference voltage is input into the oscillation unit; and
a correction unit that compares an absolute value of frequency difference between a frequency of the frequency-divided signal in the third state and a frequency of the frequency-divided signal in the fourth state with a desired value, and that corrects a frequency at which the oscillation unit oscillates with respect to a voltage input into the oscillation unit, such that the absolute value of the frequency difference between the frequency of the frequency-divided signal in the third state and the frequency of the frequency-divided signal in the fourth state is equivalent to the desired value.

9. The PLL circuit according to claim 8,
wherein the correction unit corrects a gain of the oscillation unit such that the absolute value of the frequency difference between the frequency of the frequency-divided signal in the third state and the frequency of the frequency-divided signal in the fourth state is equivalent to the desired value, the gain being a property of the frequency at which the oscillation unit oscillates with respect to the voltage input into the oscillation unit.

10. The PLL circuit according to claim 9,
wherein the correction unit corrects the gain of the oscillation unit such that the gain of the oscillation unit rises when the absolute value of the frequency difference is lower than the desired value, and such that the gain of the oscillation unit lowers when the absolute value of the frequency difference is higher than the desired value.

11. The PLL circuit according to claim 9, wherein the oscillation unit comprises:
an input transistor comprising a gate into which the control voltage or the reference voltage is input;
a current mirror circuit that supplies a current according to a current that flows between a source and a drain of the input transistor; and
a ring oscillator that receives the current supplied by the current mirror circuit, and oscillates at a frequency according to a magnitude of the received current.

12. The PLL circuit according to claim 11,
wherein the correction unit comprises a MOS transistor whose mutual conductance is controlled based on a result of the comparison of the frequency of the reference signal and the frequency of the frequency-divided signal,
the mutual conductance of the MOS transistor decreases when the frequency of the frequency-divided signal is higher than the frequency of the reference signal, and the mutual conductance of the MOS transistor increases when the frequency of the frequency-divided signal is lower than the frequency of the reference signal.

13. The PLL circuit according to claim 12, wherein the correction unit comprises:
   a frequency difference comparison unit that compares the absolute value of the frequency difference with the desired value, and outputs a difference signal according to a result of the comparison;
   a control value holding unit that changes a held digital control value according to the difference signal output from the frequency difference comparison unit, and holds the changed digital control value;
   a D/A conversion unit that generates an analog control value by performing D/A conversion of the changed digital control value that was output from the control value holding unit;
   wherein the MOS transistor comprises a gate into which the analog control value output from the D/A conversion unit is input, a source connected to a reference voltage, and a drain connected to the source of the input transistor.

14. The PLL circuit according to claim 13, wherein the frequency difference comparison unit comprises:
   a third counter that calculates the frequency of the frequency-divided signal in the third state by counting a number of clocks of the frequency-divided signal in the third state;
   a fourth counter that calculates the frequency of the frequency-divided signal in the fourth state by counting a number of clocks of the frequency-divided signal in the fourth state; and
   a subtractor that generates and outputs the difference signal by subtracting a value counted by the third counter from a value counted by the fourth counter, and further subtracting the desired value from a result obtained through the subtraction.

15. The PLL circuit according to claim 13,
   wherein the control value holding unit increments the held digital control value and holds the digital control value that has been incremented when the difference signal indicates that the absolute value of the frequency difference is smaller than the desired value, and decrements the held digital control value and holds a digital control value that has been decremented when the difference signal indicates that the absolute value of the frequency difference is larger than the desired value,
   the MOS transistor increases the magnitude of the current that flows between the source and the drain of the input transistor when an analog control value corresponding to the digital control value that has been incremented is input into the gate, and reduces the magnitude of the current that flows between the source and the drain of the input transistor when an analog control value corresponding to the digital control value that has been decremented is input into the gate, and
   the gain of the oscillation unit rises when the magnitude of the current that flows between the source and the drain of the input transistor increases, and lowers when the magnitude of the current that flows between the source and the drain of the input transistor decreases.

* * * * *